United States Patent
Heschel

(10) Patent No.: US 6,818,464 B2
(45) Date of Patent: Nov. 16, 2004

(54) DOUBLE-SIDED ETCHING TECHNIQUE FOR PROVIDING A SEMICONDUCTOR STRUCTURE WITH THROUGH-HOLES, AND A FEED-THROUGH METALIZATION PROCESS FOR SEALING THE THROUGH-HOLES

(75) Inventor: Matthias Heschel, Rodovre (DK)

(73) Assignee: Hymite A/S, Lyngby (DK)

( * ) Notice: Subject to any disclaimer, the term of this patent is extended or adjusted under 35 U.S.C. 154(b) by 0 days.

(21) Appl. No.: 10/264,440

(22) Filed: Oct. 4, 2002

(65) Prior Publication Data

US 2003/0071283 A1 Apr. 17, 2003

Related U.S. Application Data

(60) Provisional application No. 60/329,699, filed on Oct. 17, 2001.

(51) Int. Cl.[7] .................................................. H01L 21/00
(52) U.S. Cl. .......................................... 438/22; 438/119
(58) Field of Search ............................. 438/22, 53–55, 438/455–456, 700–703, 119

(56) References Cited

U.S. PATENT DOCUMENTS

| | | |
|---|---|---|
| 4,897,711 A | 1/1990 | Blonder et al. |
| 4,903,120 A | 2/1990 | Beene et al. |
| 4,904,036 A | 2/1990 | Blonder |
| 5,023,881 A | 6/1991 | Ackerman et al. |
| 5,068,203 A | 11/1991 | Logsdon et al. |
| 5,308,442 A | 5/1994 | Taub et al. |
| 5,656,507 A | 8/1997 | Welbourn et al. |
| 5,703,394 A | 12/1997 | Wei et al. |
| 5,891,354 A | 4/1999 | Lee et al. |
| 5,898,806 A | 4/1999 | Nishimoto |
| 6,028,001 A | 2/2000 | Shin |
| 6,036,872 A | * 3/2000 | Wood et al. ............... 216/2 |
| 6,072,815 A | 6/2000 | Peterson |
| 6,117,794 A | 9/2000 | Dormer et al. |
| 6,139,761 A | 10/2000 | Ohkuma |
| 6,221,769 B1 | 4/2001 | Dhong et al. |
| 6,577,427 B1 | * 6/2003 | Gee et al. ............... 359/224 |
| 6,660,564 B2 | 12/2003 | Brady |

FOREIGN PATENT DOCUMENTS

| | | |
|---|---|---|
| EP | 0 430 593 A2 | 6/1991 |
| EP | 0 795 766 A1 | 9/1997 |
| EP | 0 884 782 A1 | 12/1998 |
| EP | 1 061 578 A1 | 12/2000 |
| WO | WO 00/07225 | 2/2000 |
| WO | WO 00/41281 | 7/2000 |
| WO | WO 01/24228 A2 | 4/2001 |

OTHER PUBLICATIONS

Linder et al., "Fabrication Technology for Wafer Through-Hole interconnections and three–Dimensional Stacks of Chips and Wafers," Micro Electro Mechanical Systems, 1994, MEMS '94, Proceedings, IEEE Workshop on Oiso, Japan Jan. 25–28, 1994, New York, NY, USA, IEEE, pp. 349–351.

Mita Y. et al., "Embedded–Mask–Methods for mm–scale multi–layer vertical/slanted Si structures," Proceedings IEEE thirteenth Annual International Conference on Micro electro Mechanical Systems, Jan. 23–27, 2000, pp. 300–305.

* cited by examiner

Primary Examiner—Dung A. Le
(74) Attorney, Agent, or Firm—Fish & Richardson P.C.

(57) ABSTRACT

Double-sided etching techniques are disclosed for providing a semiconductor structure with one or more through-holes. The through-holes may be sealed hermetically such as by a feed-through metallization process. The feed-through metallization process may include using an electroplating technique and may provide electrical contact to an optoelectronic or integrated circuit encapsulated in a package with the semiconductor structure used as a lid.

14 Claims, 25 Drawing Sheets

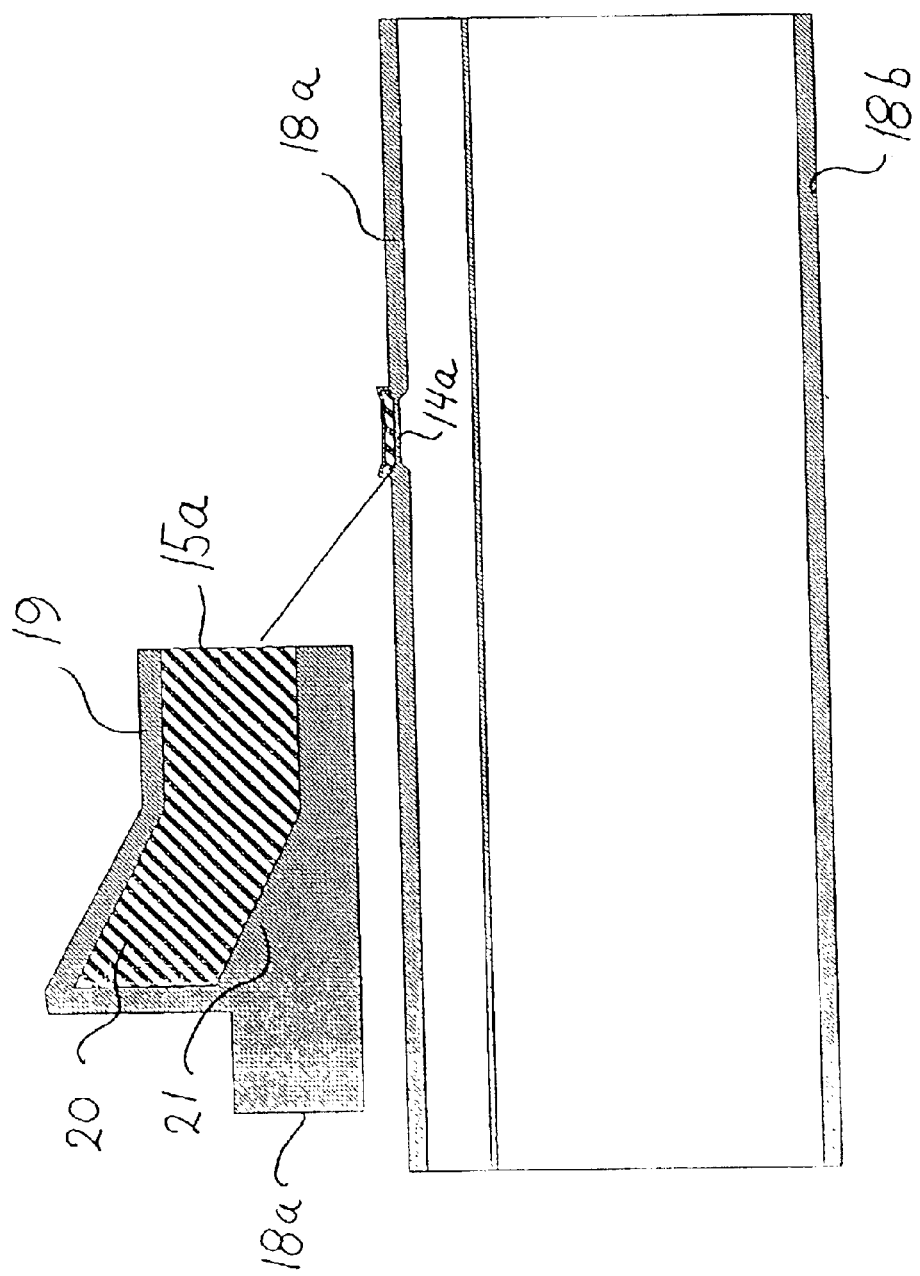

DOUBLE-SIDED ETCHING TECHNIQUE FOR PROVIDING A SEMICONDUCTOR STRUCTURE WITH THROUGH-HOLES, AND A FEED-THROUGH METALIZATION PROCESS FOR SEALING THE THROUGH-HOLES

CROSS-REFERENCE TO RELATED APPLICATIONS

This application claims priority from U.S. Provisional Patent Application No. 60/329,699, filed on Oct. 17, 2001.

FIELD OF THE INVENTION

The present invention relates to a semiconductor structure with one or more through-holes.

BACKGROUND

Subassemblies for optoelectronic devices or optoelectronic hybrid integrated circuits may include a semiconductor structure formed as a lid. The lid may be sealed to a base that includes or is connected, for example, to an optical waveguide. The lid may provide a cover for one or more optoelectronic chips or components being optically coupled to the waveguide. Typically, electrical or optical connections may need to be provided to the chips or components mounted within the assembly.

SUMMARY

According to one aspect, a method is disclosed to provide a semiconductor structure that has front and back surfaces substantially with one or more through-holes. The method includes etching the semiconductor structure from the back surface in one or more back surface areas corresponding to positions of the one or more through-holes and etching the semiconductor structure from the front surface in one or more front surface areas corresponding to the positions of the one or more through-holes. The front and back surfaces may be etched in either order.

In some implementations, one or more of the following features may be present. The semiconductor structure may include a first semiconductor layer facing the back surface, a second semiconductor layer facing said front surface, and a substantially etch-resistant layer arranged between the first and the second semiconductor layers. The method then may include etching from the back surface through the first semiconductor layer and stopping the etching from the back surface when a back portion of the etch-resistant layer is exposed, where the back portion of the etch-resistant layer corresponds to one or more of the back surface areas. The method also may include etching form the front surface through the second semiconductor layer and stopping the etching from the front surface when a front portion of the etch-resistant layer is exposed, where the front portion of the etch-resistant layer corresponding to one or more of the front surface areas. At least the part of the etch-resistant layer corresponding to the position of each of the one or more through-holes may be removed to form the one or more through-holes after the etching.

At least one of the back etching step and the front etching may include using a liquid chemical etching process, an anisotropic etching process or an aqueous solution of potassium hydroxide.

Preferably, the through-holes are hermetically sealed. The through-holes may be sealed, for example, using a feed-through metallization process. In a particular implementation, hermetically sealing the through-holes includes providing an adhesion layer, a plating base, a feed-through metallization, a diffusion barrier, a wetting layer; and an anti-oxidation barrier.

Etching the back surface areas may include exposing a large back portion of the etch-resistant layer having an area larger than any exposed front portion of the etch resistant layer. The etch-resistant layer may include a material selected, for example, from the group of silicon nitride, silicon oxynitride and silicon dioxide. The etch-resistant layer may include a sandwich layer comprising alternating layers of at least silicon dioxide, silicon nitride and silicon oxynitride.

The semiconductor structure may be used as a lid to encapsulate an opto-electronic component. In that case, the through-holes may be used to establish connections to the components through the encapsulation. The connections may, for example, electrical connections, optical connections, or any other suitable kind of connection which may be needed to communicate with a component or to enable a component to operate.

In another aspect, a semiconductor structure includes a front surface, a back surface arranged substantially opposite to the front surface, and at least one feed-through interconnect each of which includes through-hole connections. Each of the through-holes includes feed-through metallization to provide a conductive path between a lower part of the structure and an upper part of the structure.

Some implementations may include one or more of the following features. For each feed-through interconnect, the feed-through metallizations of the through-holes may be electrically connected to each other within the lower part of the structure and the upper part of the structure. The through-holes may be hermetically sealed, for example, by feed-through metallization.

In a related aspect, an optoelectronic assembly structure may include a semiconductor base with a major surface and an optical waveguide integrally formed along the major surface. An optoelectronic chip may be optically coupled to the waveguide, and a semiconductor lid may be sealed to the base to form an enclosure that covers the chip. The lid includes a front surface, a back surface arranged substantially opposite the front surface, and at least one feed-through interconnect each of which includes through-hole connections. At least one through-hole may be provided with feed-through metallization to provide a current path through the lid to the optoelectronic chip. The optoelectronic chip may include, for example, a laser or other devices. The through-hole connections may provide a hermetic seal for the optoelectronic chip.

Various implementations may include one or more of the following advantages. Formation of a semiconductor structure with through-holes may be simplified. Use of the etch-resistant layer may make the method is easy to control. Therefore, the cross-sectional dimensions of each through-hole may be very well defined. The techniques may be convenient for forming electrical or optical communication paths through a semiconductor structure while maintaining a hermetic sealing of the structure. Furthermore, the techniques may be suited for mass production.

In the present context, the phrase 'a substantially etch-resistant layer' should be interpreted as a layer of material which is at least substantially resistant to the etching process performed on the first semiconductor layer and the etching process performed on the second semiconductor layer. Thus, the substantially etch-resistant layer should be able to resist said etching processes, at least to the extend that at least some of the material of the substantially etch-resistant layer remains after the etching processes of the first and second semiconductor layers have been performed.

A relatively high total conducting capability of the structure may be provided by the use of a large number of through-holes.

Other features and advantages will be readily apparent from the following detailed description, the accompanying drawings and the claims.

BRIEF DESCRIPTION OF THE DRAWINGS

FIGS. 1a–1s are cross-sectional side views of a semiconductor structure during various steps according to embodiments of the methods of the present invention, with FIGS. 1a–1j illustrating various steps of etching processes, while FIGS. 1k–1s illustrate various steps of metallization processes.

DETAILED DESCRIPTION OF PREFERRED EMBODIMENTS

According to an embodiment of the present invention, a semiconductor structure is fabricated, which structure may have the form of a semiconductor lid and be used as a lid for a subassembly for optoelectronic integrated circuits, where the lid may provide a cover for an optoelectronic chip or component being optically coupled to a waveguide.

Representative substrates for the fabrication of semiconductor structures or lids according to the present invention comprise single-crystalline silicon wafers with <100> or <110> surface orientations. One method of semiconductor structure fabrication consistent with the present invention is detailed below with reference to FIGS. 1a–1s.

Figure 1A:
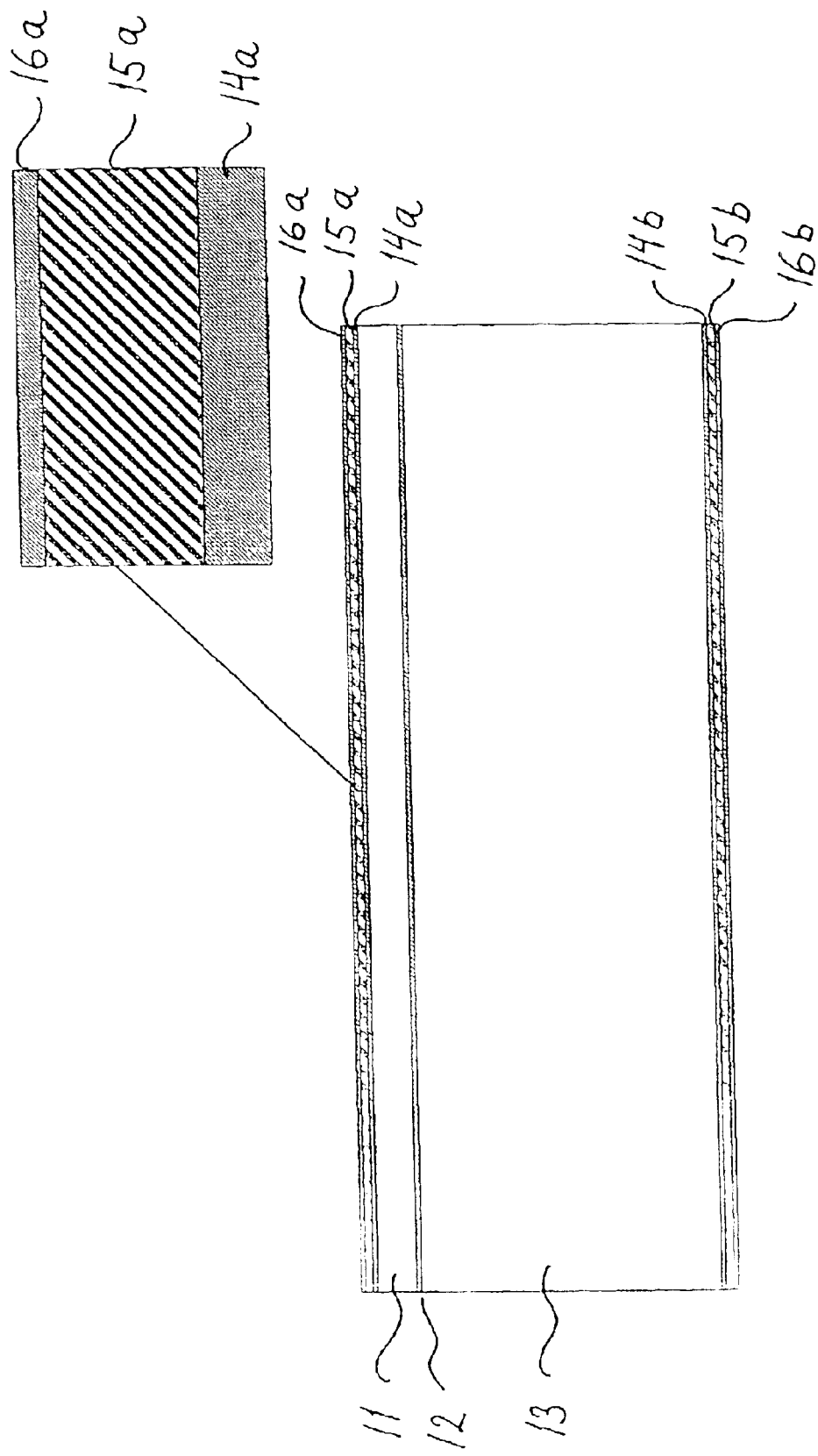
Figure 1B:
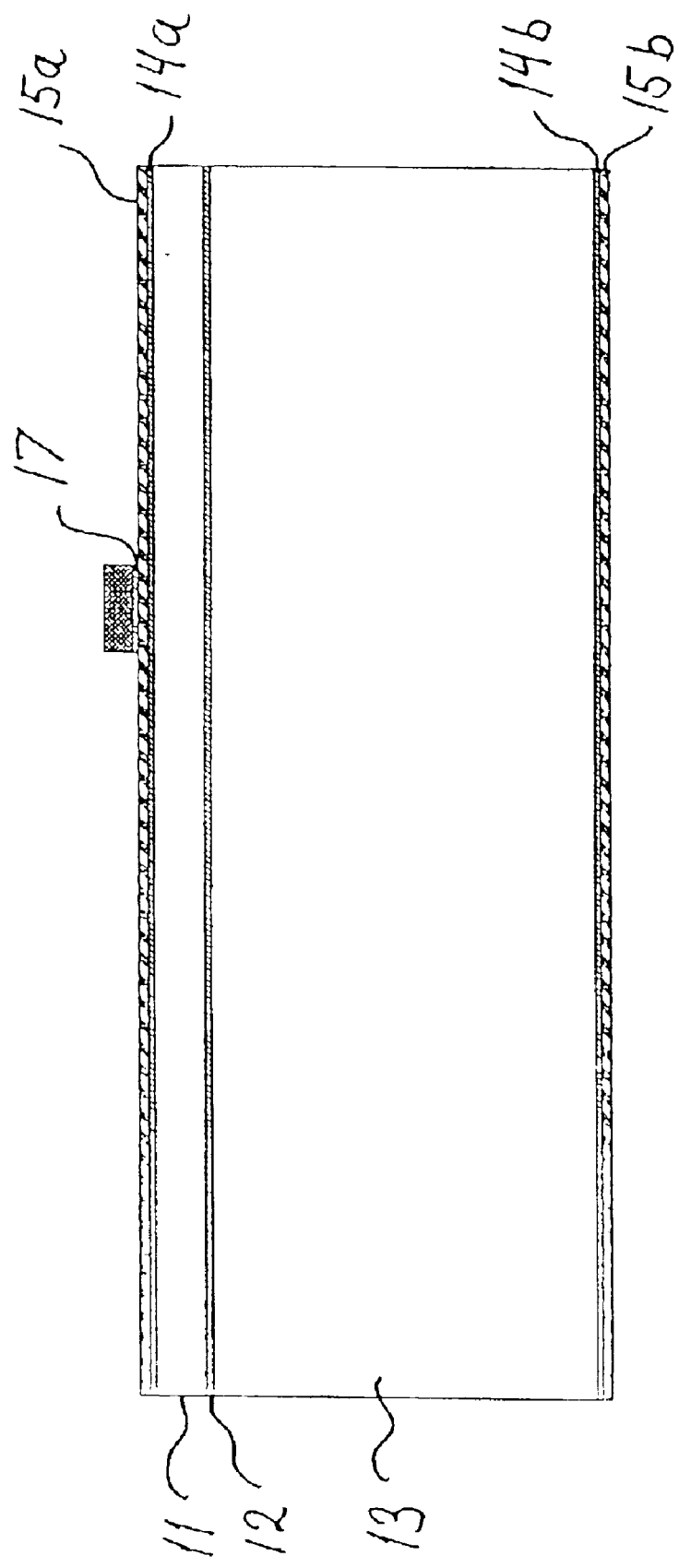
Figure 1C:
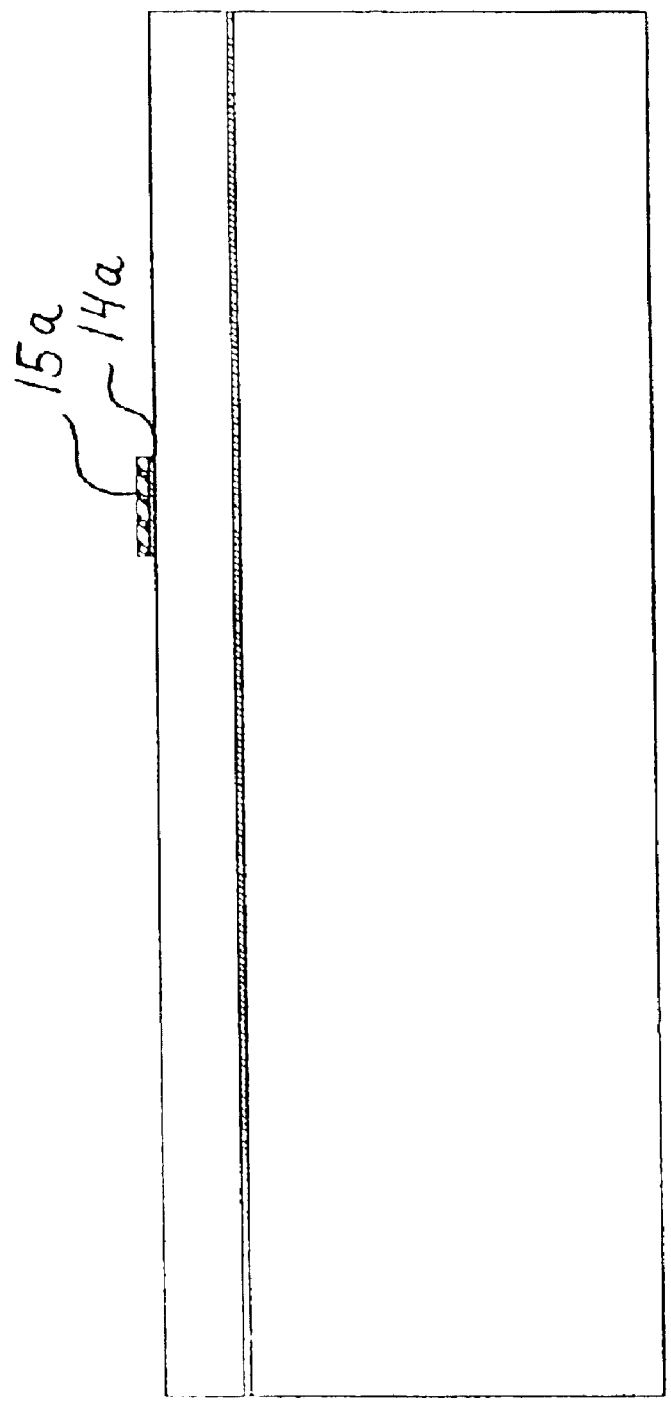
Figure 1E:
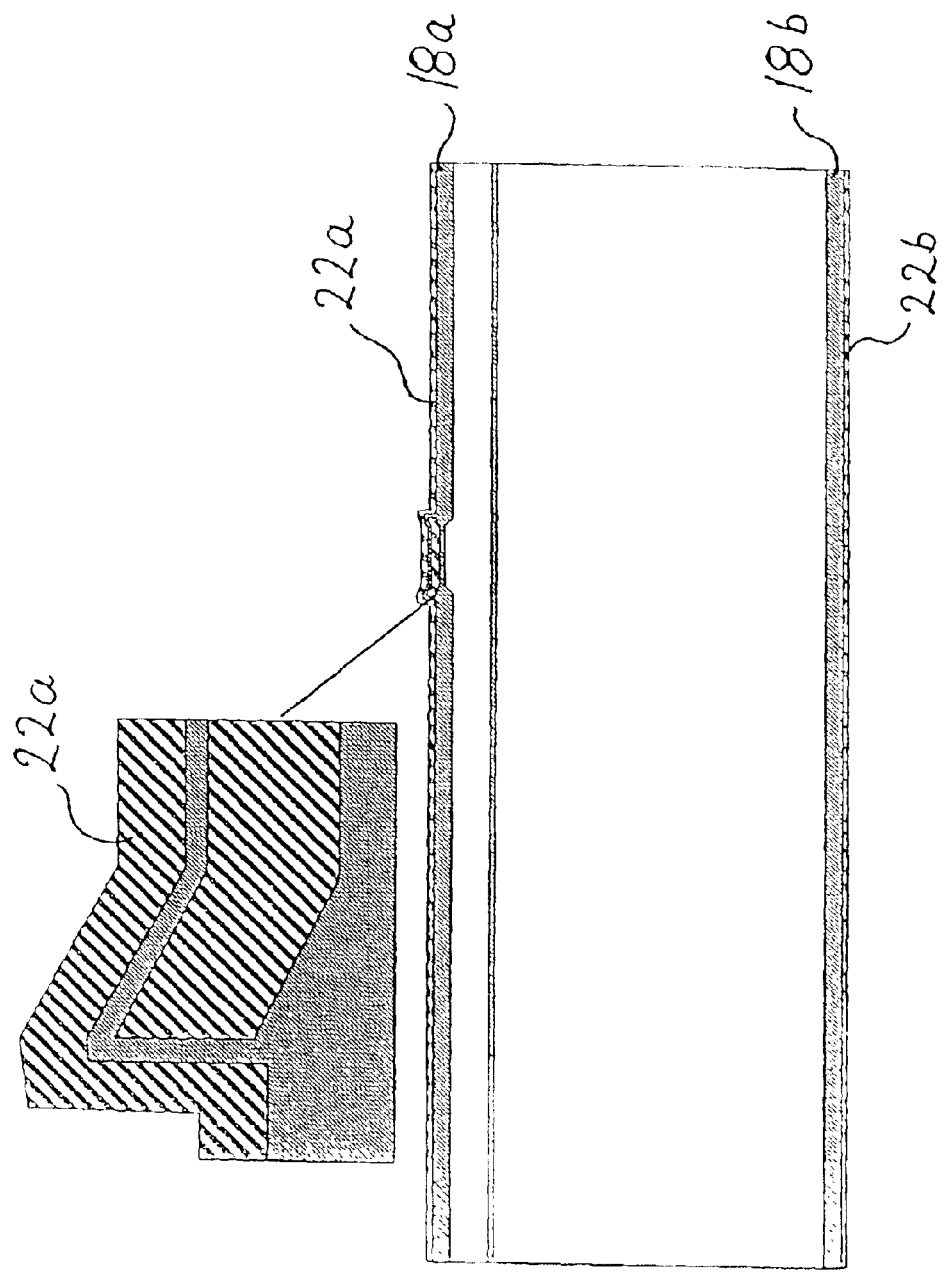
Figure 1F:
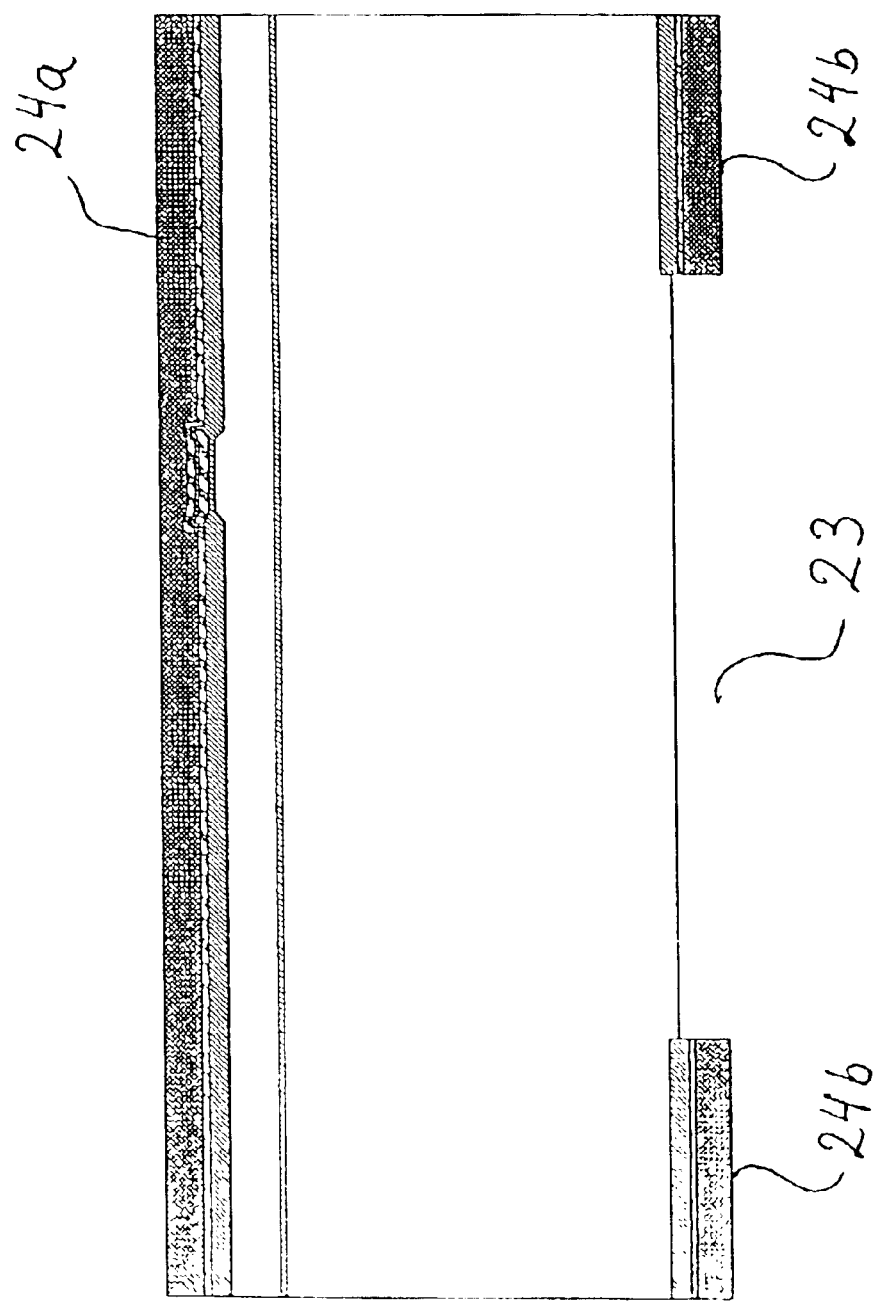
Figure 1G:
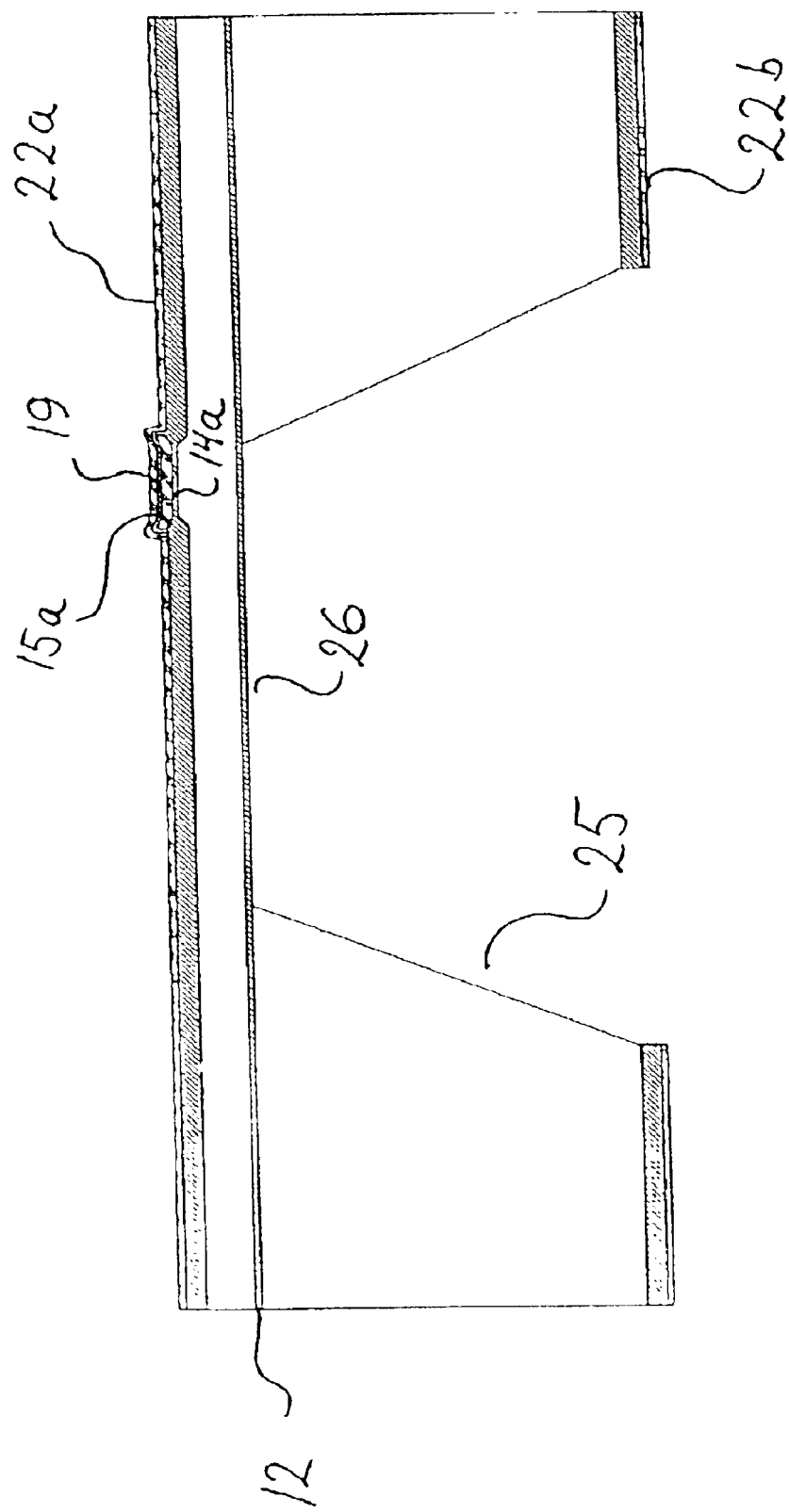
Figure 1H:
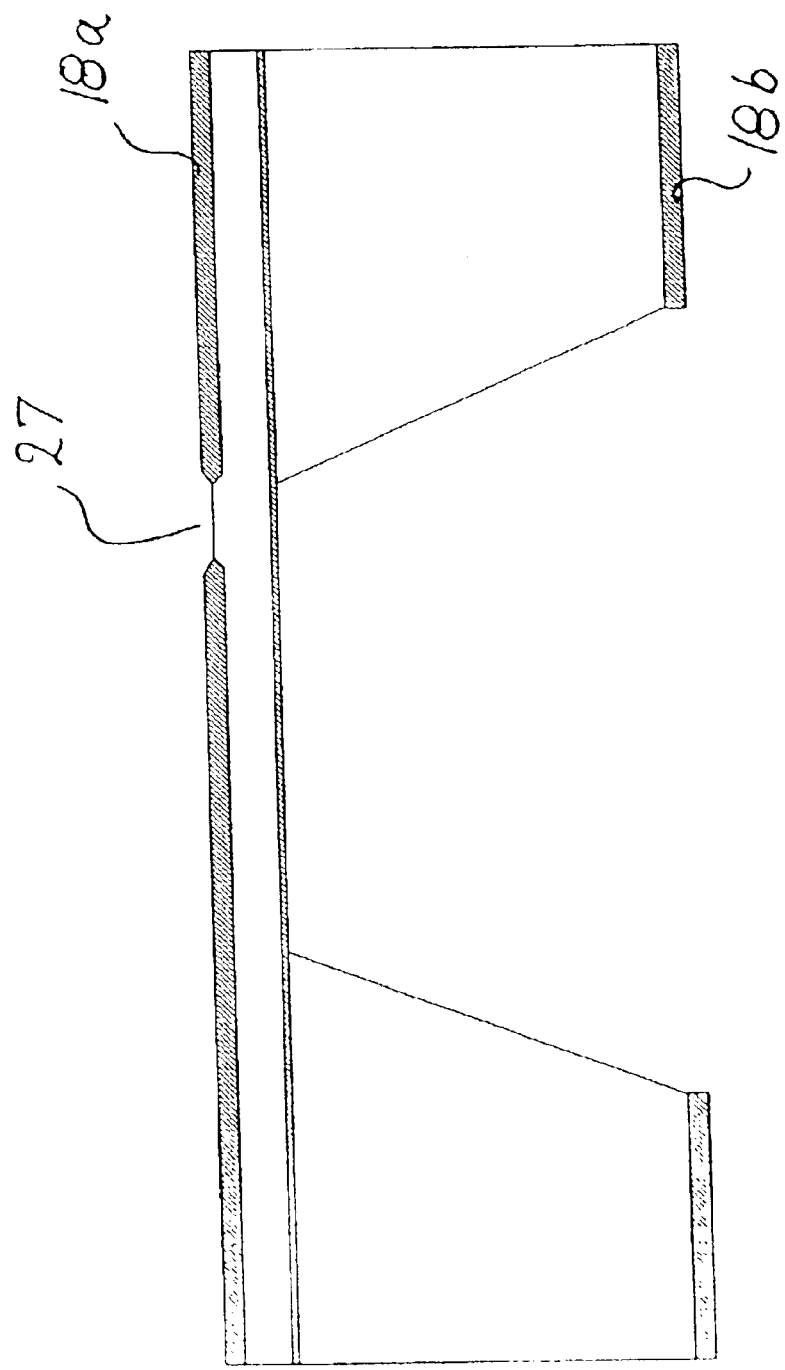
Figure 1I:
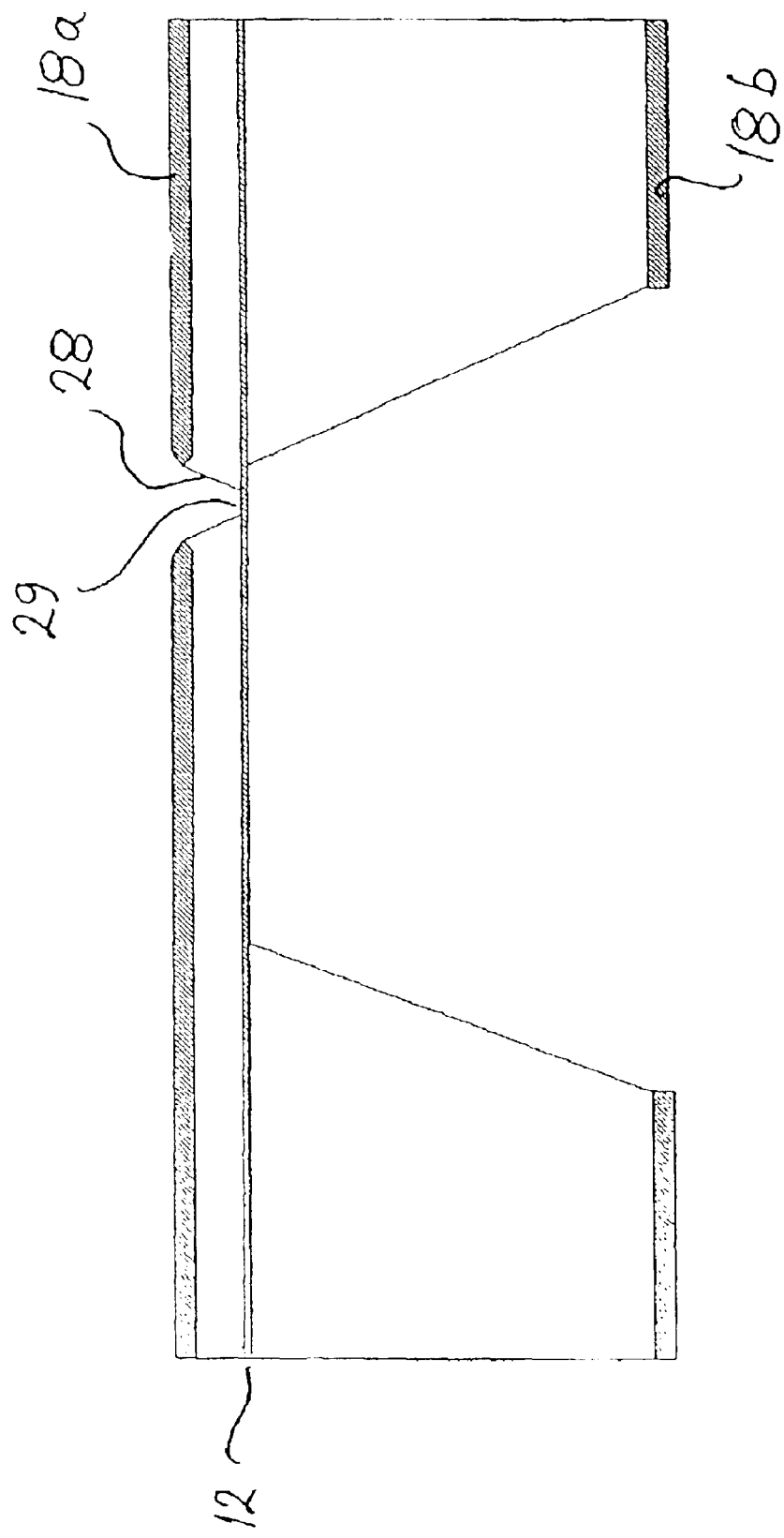
Figure 1J:
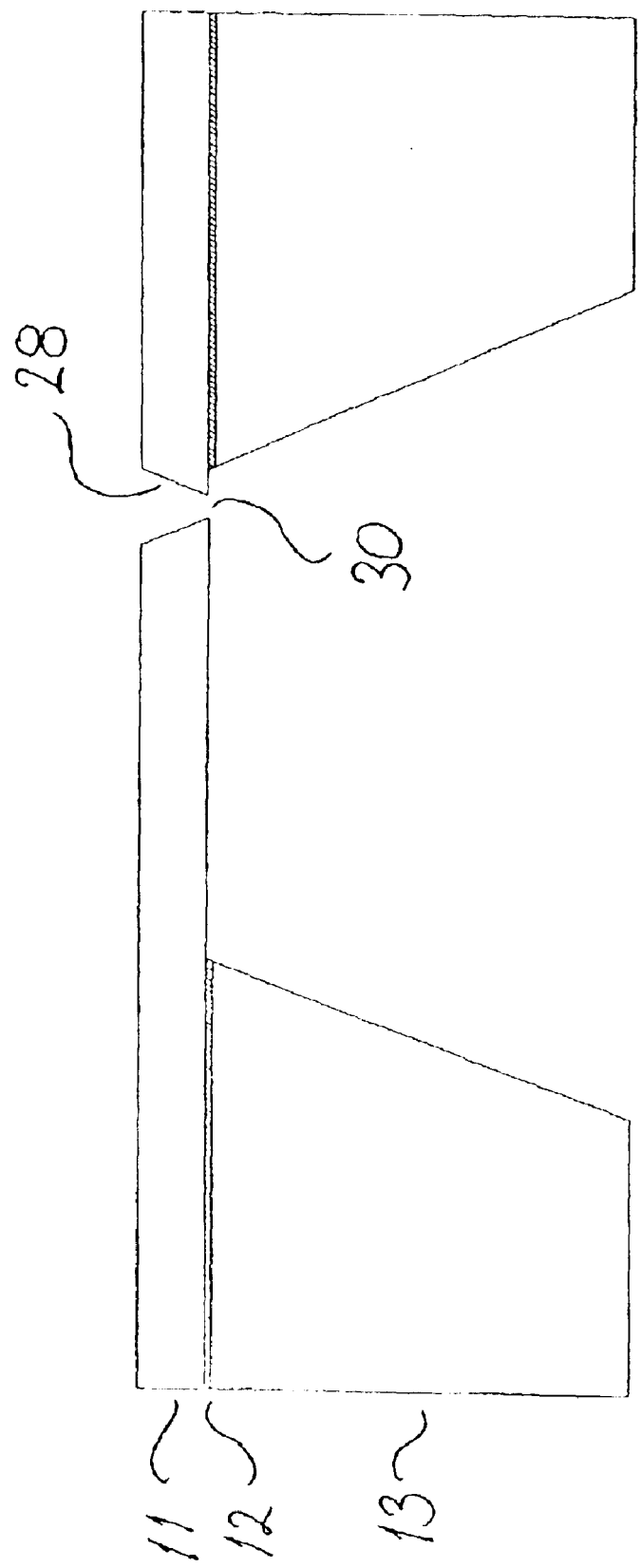
Figure 1K:
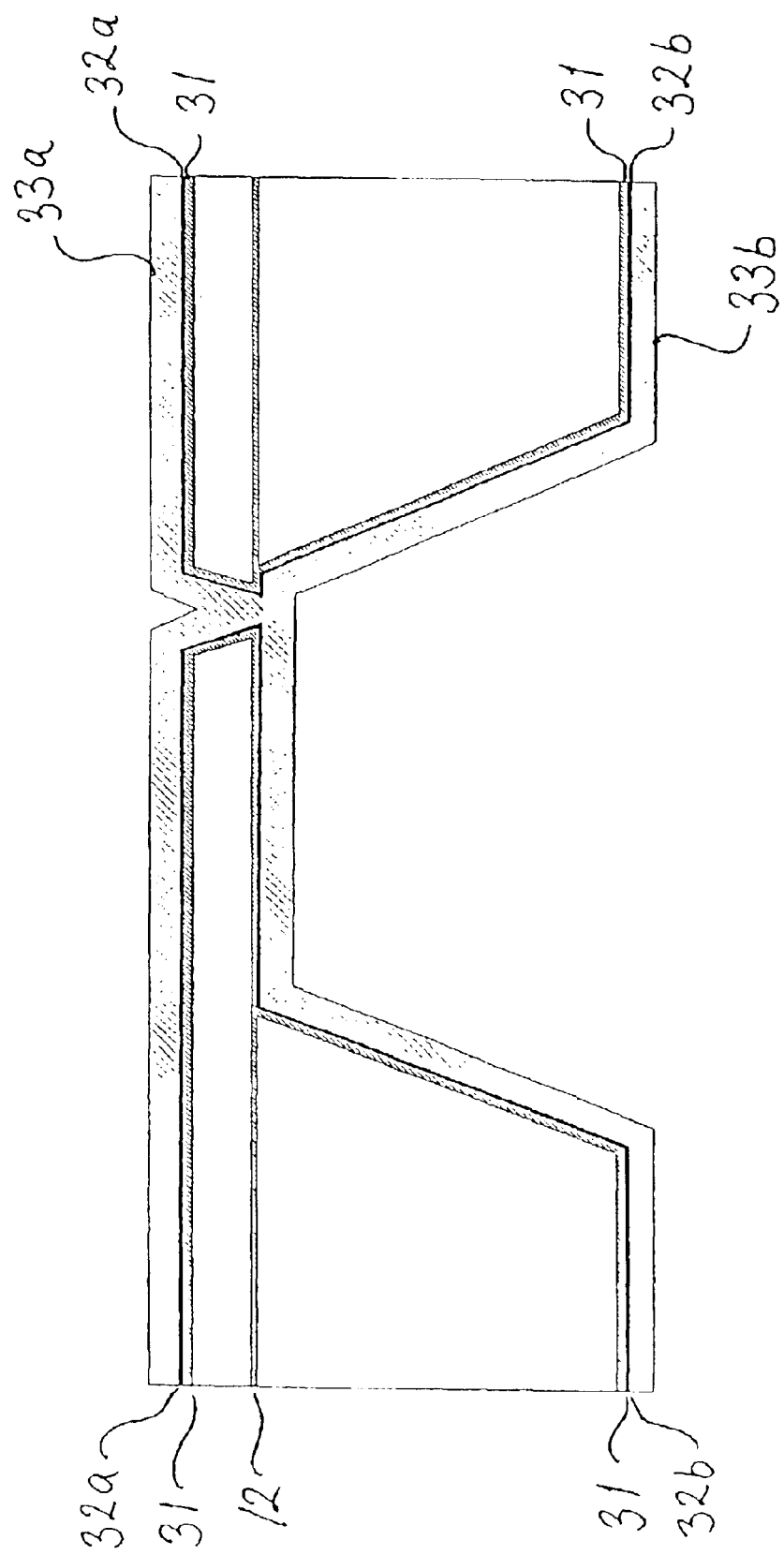
Figure 1I:
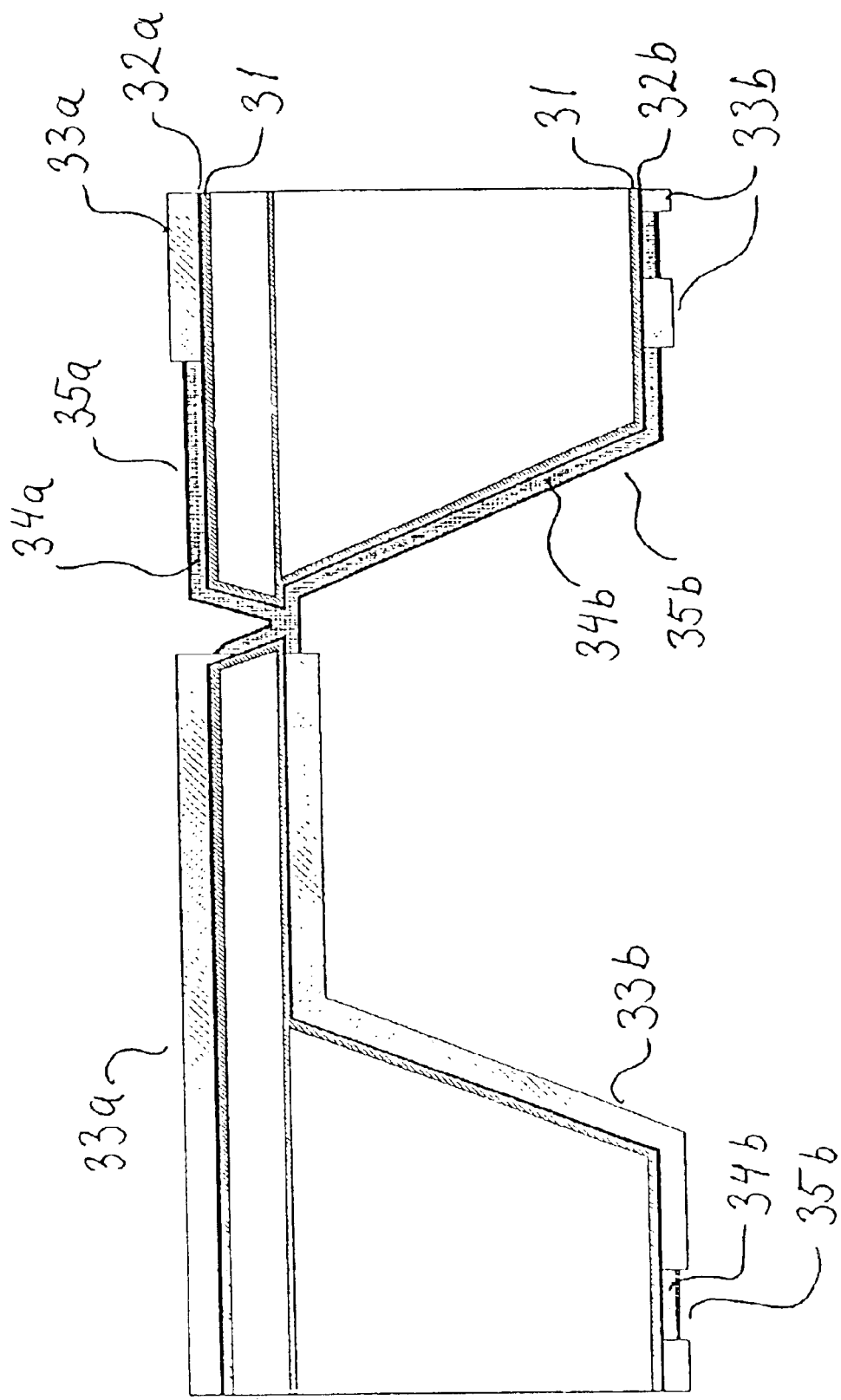
Figure 1M:
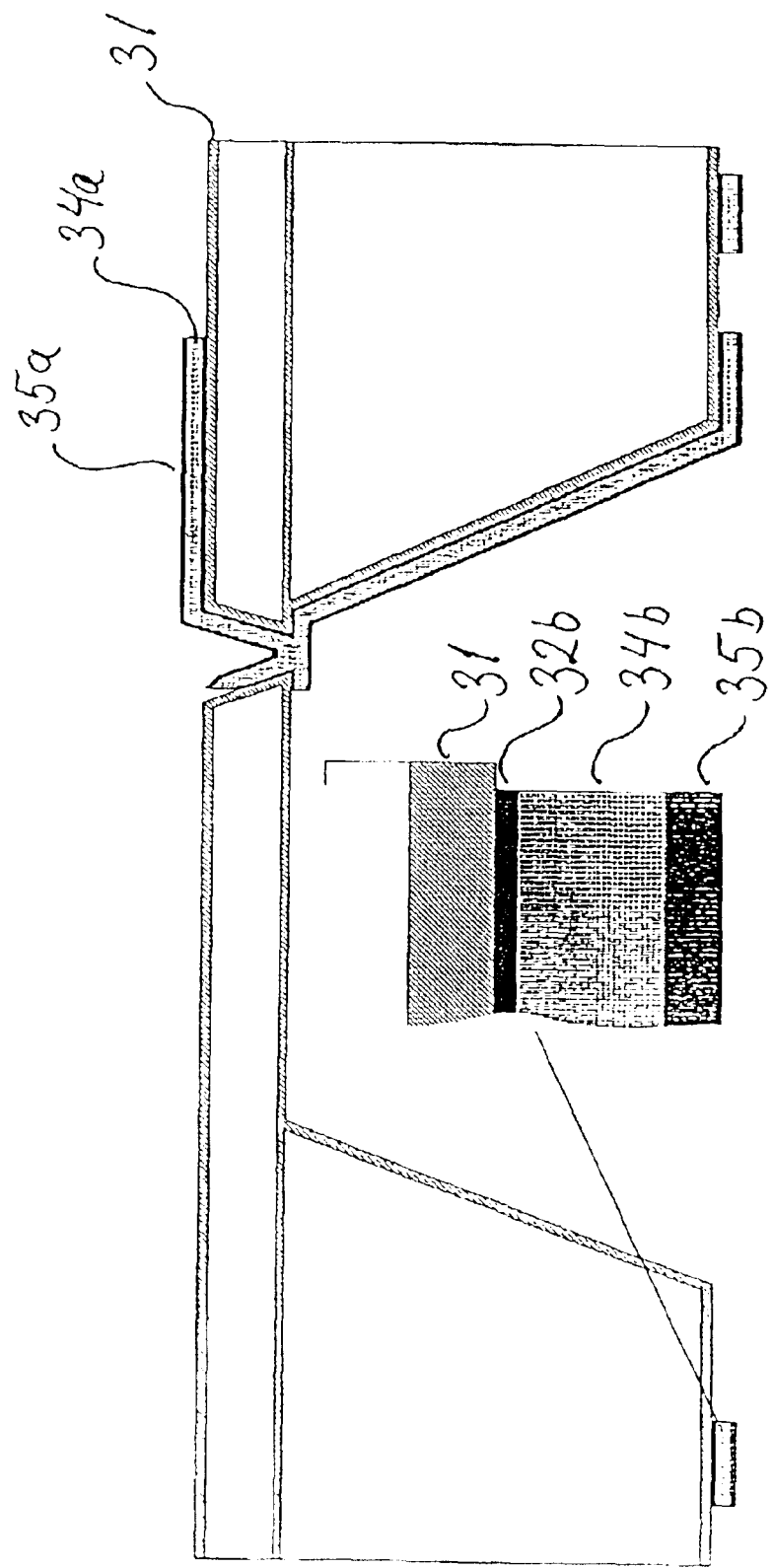
Figure 1N:
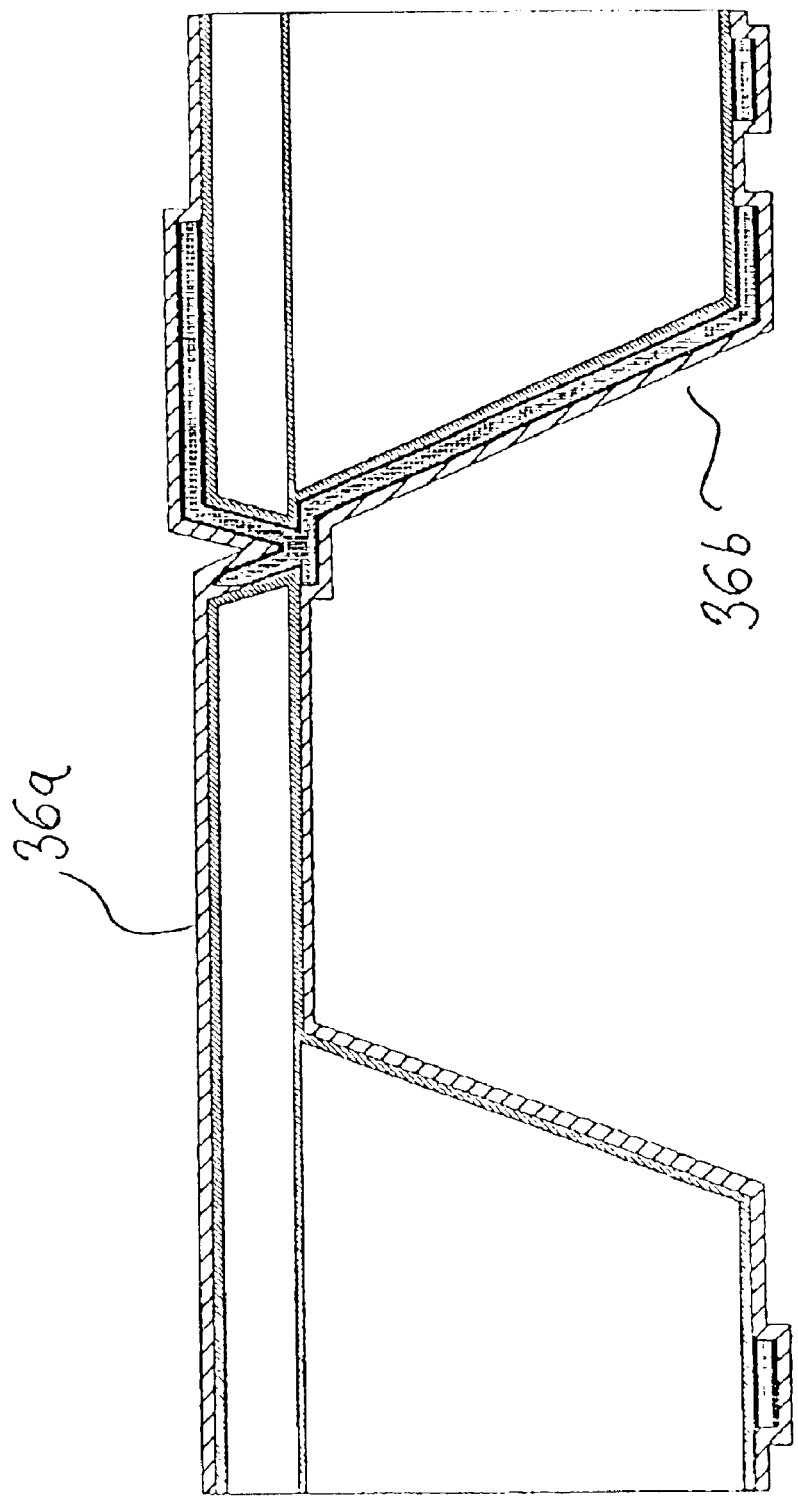
Figure 10:
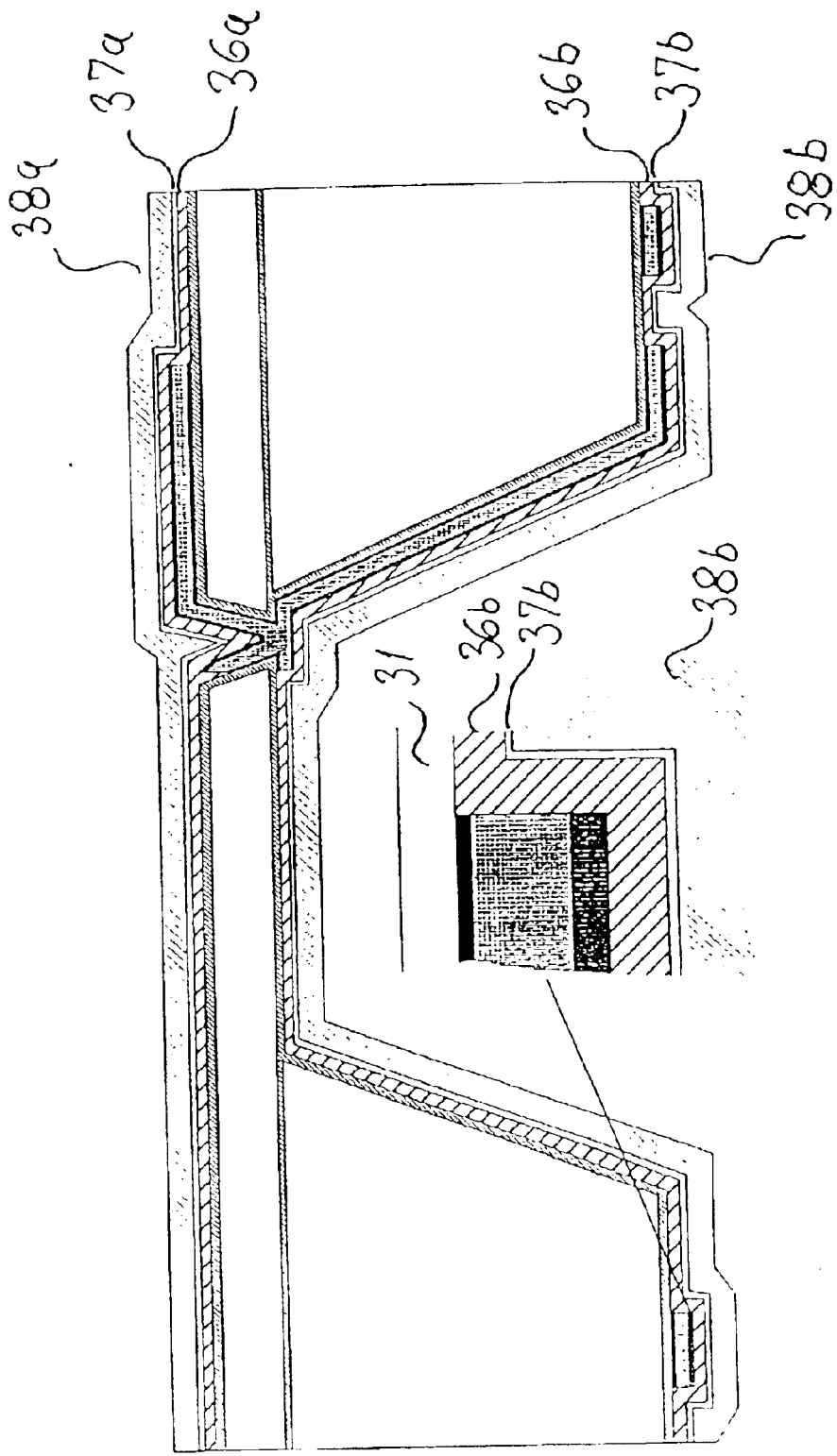
Figure 1P:
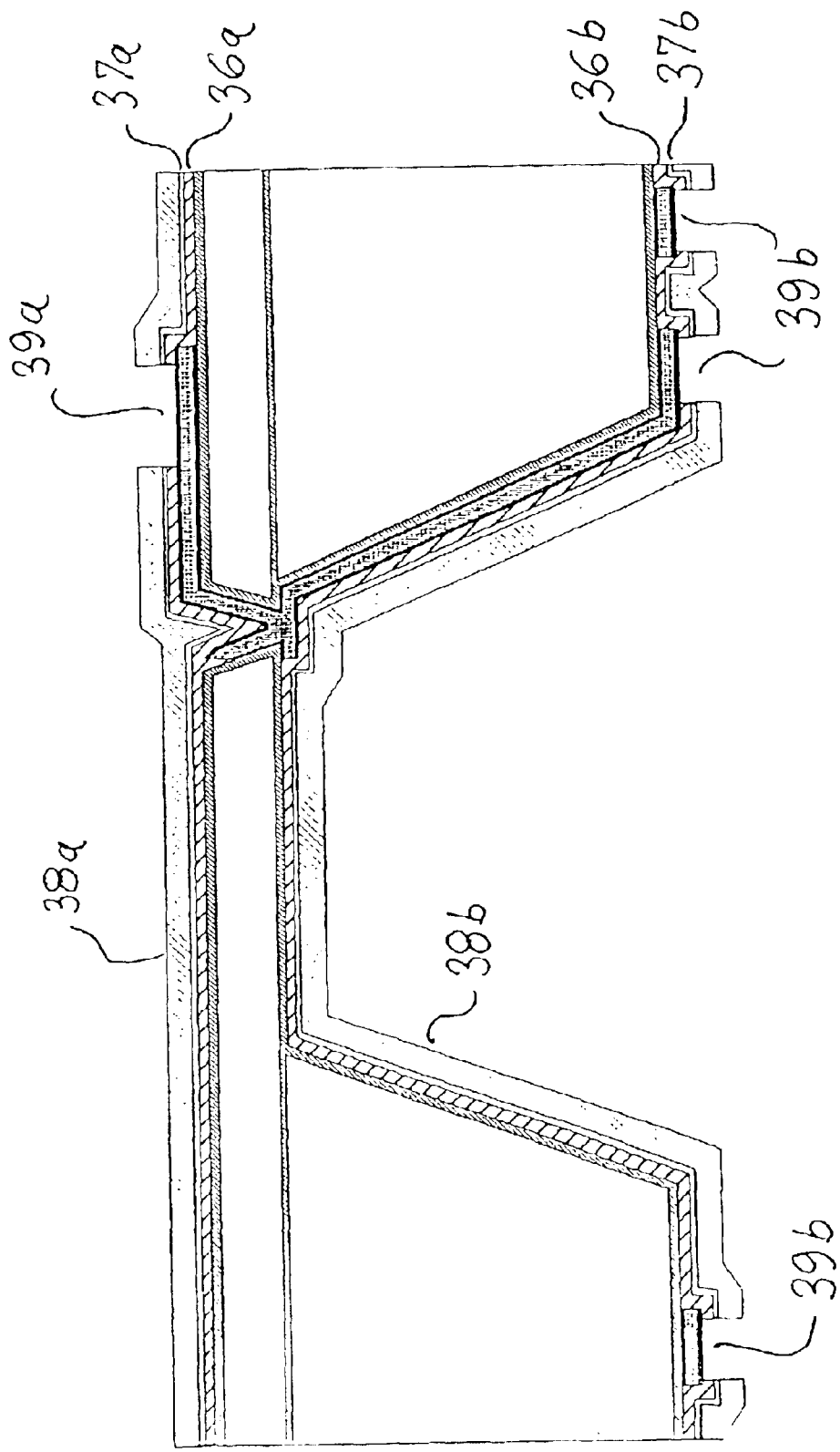
Figure 1Q:
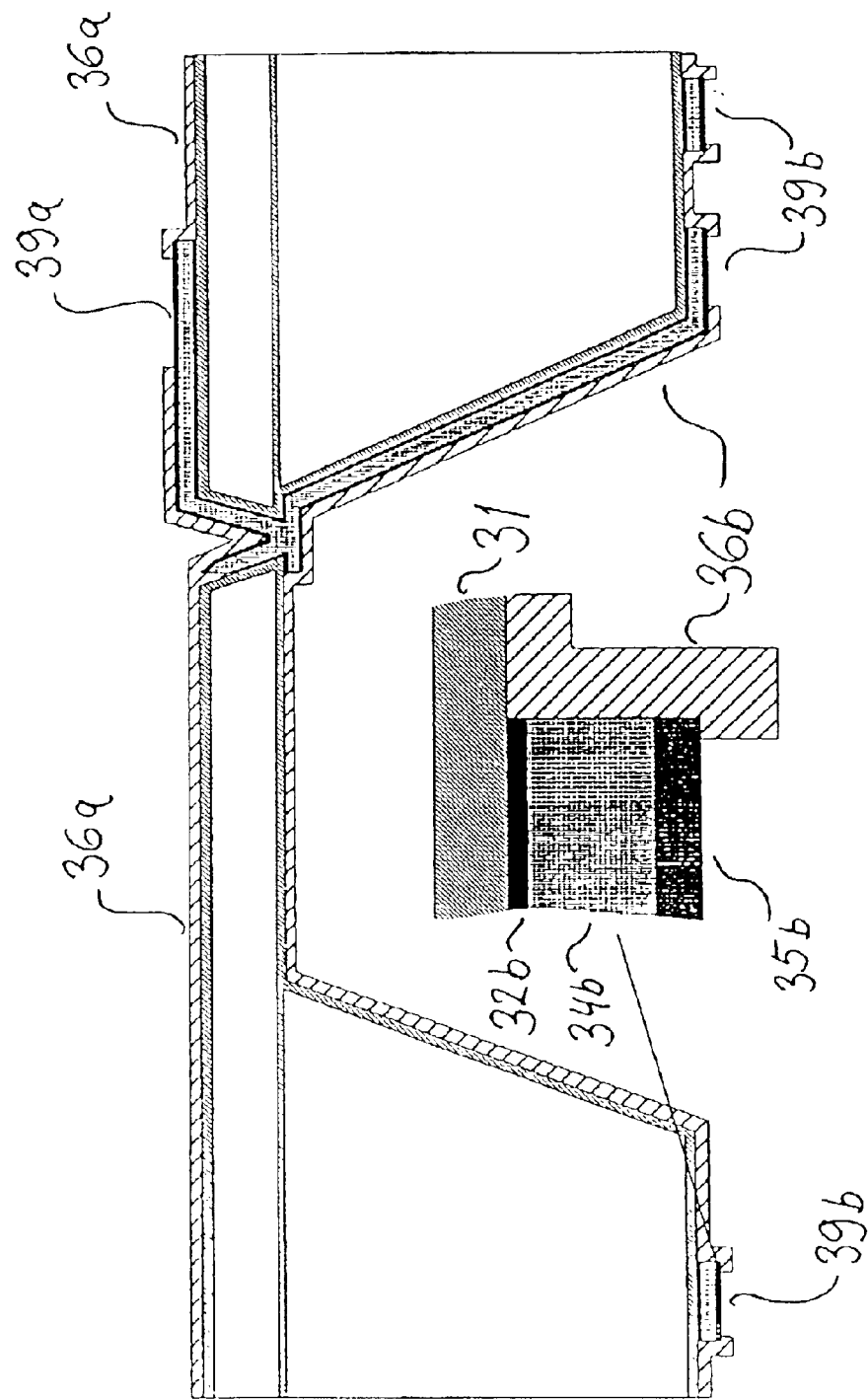
Figure 1R:
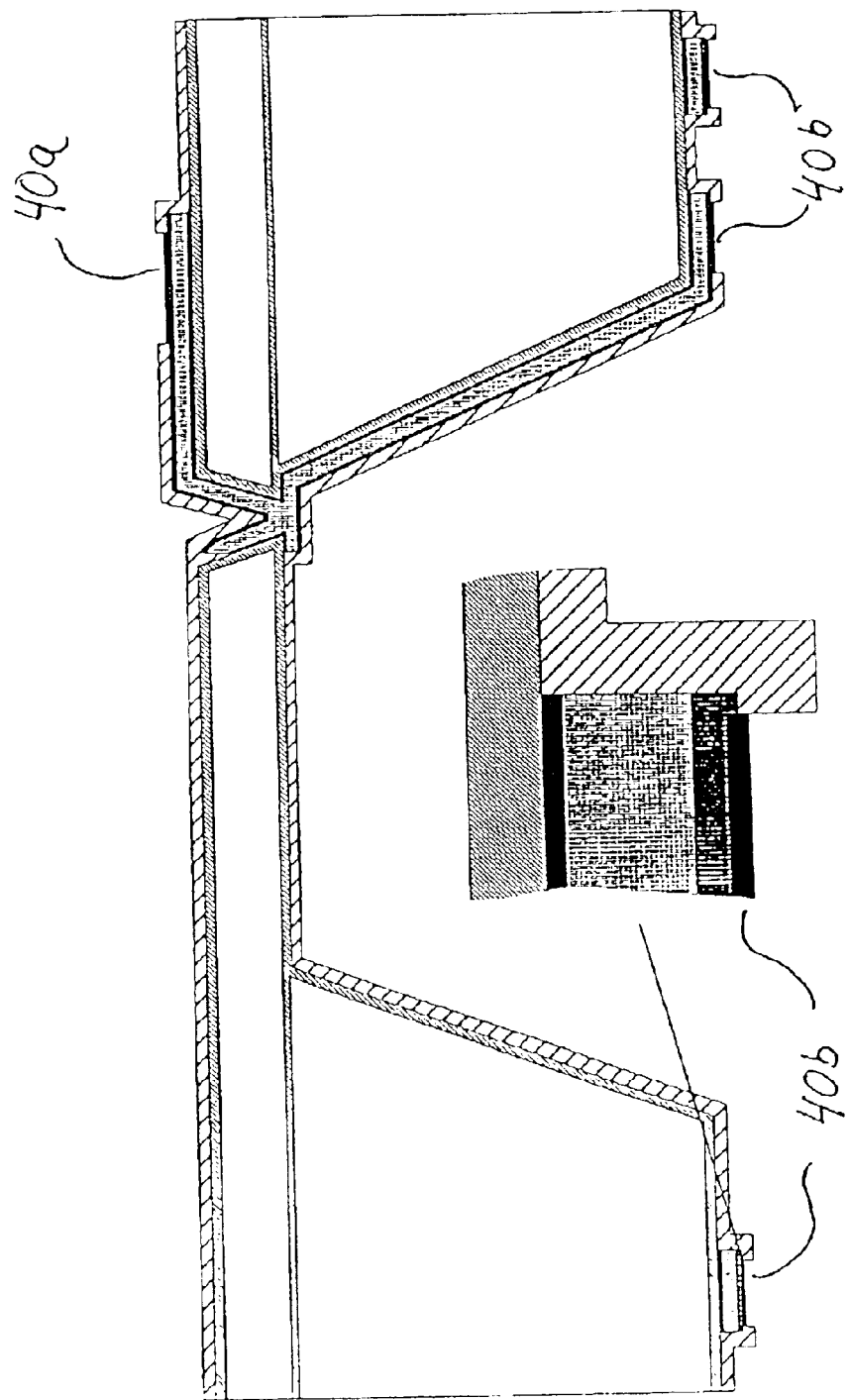
Figure 1S:
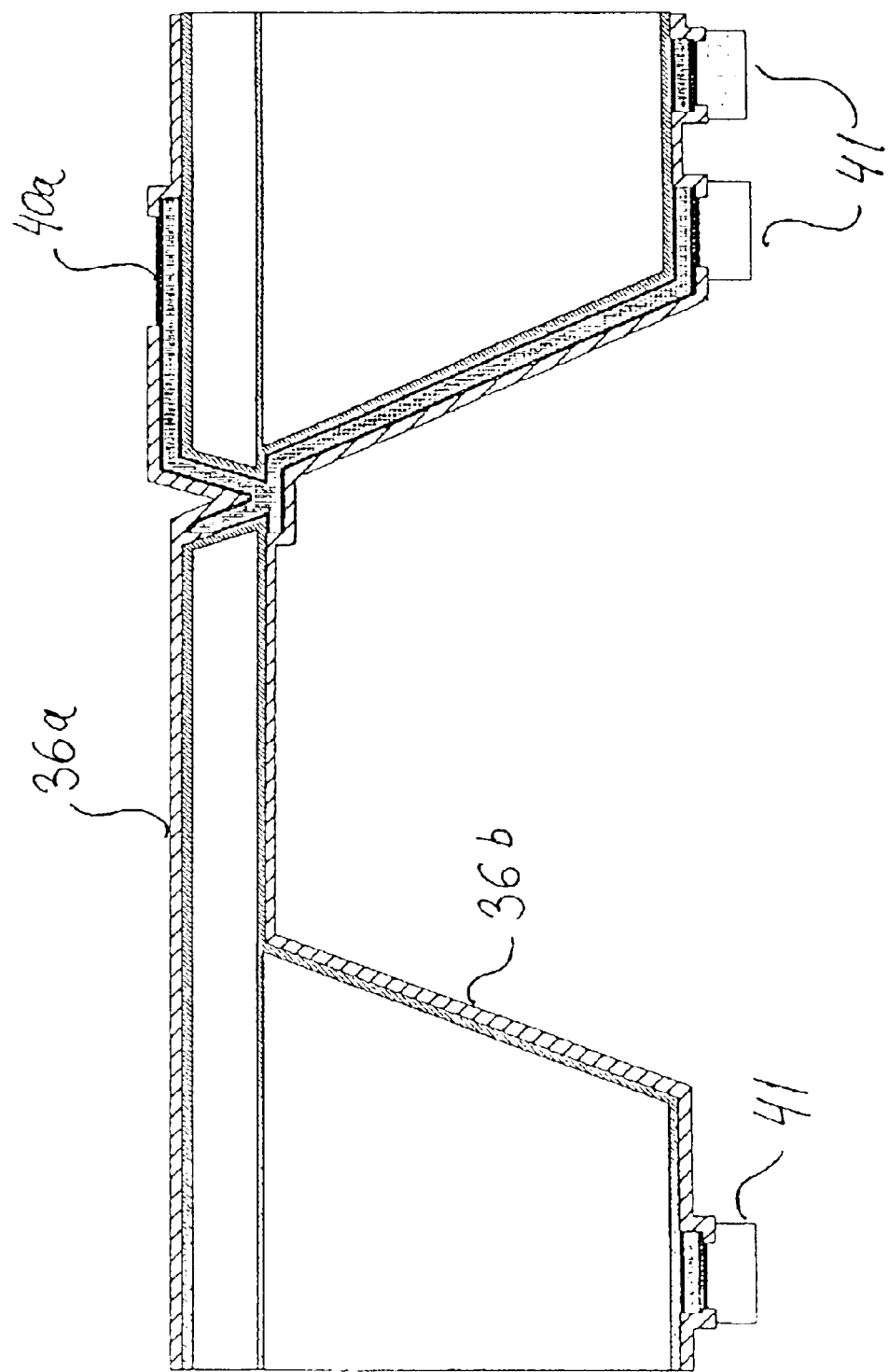

The structure shown in FIGS. 1a–1s has the form of a semiconductor lid. Here, a plurality of lids are fabricated on a wafer having a silicon-on-insulator (SOI) structure, see FIG. 1a. The wafer has a <100> single-crystalline silicon front layer 11, a silicon dioxide insulating layer 12, and a <100> single-crystalline silicon back layer 13. The wafer has a diameter of 100 mm±0.5 mm, the thickness of the front layer 11 is 20 $\mu$m±2 $\mu$m, the thickness of the silicon dioxide layer 12 is about 1 $\mu$m, and the thickness of the supporting back silicon layer 13 is 350 $\mu$m±25 $\mu$m. It is important that the silicon dioxide insulator 12 is thick enough to resist a double-sided through-hole etching. The resistivity of both the front layer 11 and the back layer 13 is about 1–20 $\Omega$cm.

A wafer of the above described SOI structure may be delivered by a wafer supplier such as for example SICO Wafer GmbH, Germany.

A wafer of the SOI structure may be fabricated by having a first and a second silicon substrate being bonded to each other by use of a thermal silicon fusion bonding process. The thickness of the front silicon substrate may then be reduced to a desired thickness by a grinding process followed by a chemical mechanical polishing, CMP, process.

Various steps of etching processes according to the present invention are illustrated in FIGS. 1a–1j, with FIGS. 1a–1c showing the first steps, in which one or more areas for one or more through-hole openings are defined on the front side of the silicon front layer 11. The first step is a local-oxidation-of-silicon (LOCOS) process. This process comprises a thermal oxidation of silicon, resulting in front and back first silicon dioxide layers 14a, 14b, a low-pressure-chemical-vapour-deposition (LPCVD) process resulting in first silicon nitride layers 15a, 15b, and a thermal oxidation of the surface of the silicon nitride, the latter resulting in a conversion oxide 16a, 16b.

The conversion oxide 16a on the front side is patterned according to the areas of the front layer through-hole openings, and the non-patterned conversion oxide is removed from the front and the backside using buffered hydrofluoric acid (BHF), see FIG. 1b.

The remaining conversion oxide 17 serves as a mask to pattern the silicon nitride layer 15a using phosphoric acid. The exposed first silicon dioxide 14a, 14b and the remaining conversion oxide 17 are then stripped in BHF, leaving one or more areas of the silicon nitride layer 15a, thereby defining the areas of the through-hole openings, see FIG. 1c.

Next, as shown in FIG. 1d, thermal second silicon dioxide layers 18a, 18b are grown by a LOCOS process, which also converts the surface of the silicon nitride into a conversion oxide 19. The edges of the silicon nitride 20 are lifted, resulting in the well-known bird's beak 21.

Now, second silicon nitride layers 22a, 22b are deposited by a LPCVD process to serve as an etch mask in a subsequent through-hole etching, see FIG. 1e.

Next, the area 23 for a through-hole opening on the backside is defined by a photolithographic process, in which layers of photoresist 24a, 24b are covering the front side and the remaining part of the backside. The so exposed second silicon nitride 22b and second silicon dioxide 18b are subsequently etched using reactive ion etching (RIE), see FIG. 1f.

After stripping the remainder of the photoresist 24a, 24b, the exposed area 23 of silicon on the backside of the structure is etched anisotropically in potassium hydroxide (KOH), thereby forming a tapered pyramidal shape 25 reaching from the backside of the structure up to, but not through, the silicon dioxide insulating layer 12, as the etch process stops at the buried insulator layer 12, see FIG. 1g, thereby leaving an exposed back portion 26 of the insulating area 12. The KOH etch may use a hot aqueous solution of 28% by weight of KOH at 80° C. in temperature. The etch time of the backside etch may be around 5 hours.

The second silicon nitride 22a, 22b is now stripped in hot phosphoric acid at 160° C. A short BHF dip removes the remaining conversion silicon dioxide layer 19 in the area(s) defined as the one or more through-hole openings. The now exposed remainder of the first silicon nitride layer 15a is stripped in hot phosphoric acid at 160° C. A short BHF dip removes the remainder of the first thermal silicon dioxide layer 14a and, thus, leaves the silicon of the through-hole opening(s) 27 on the front side exposed, see FIG. 1h. Here, the short BHF dips may be about 20 seconds.

The so exposed silicon 27 on the front side is etched in KOH thereby forming a tapered pyramidal shape 28 reaching from the front side of the structure down to, but not through, the silicon dioxide insulating layer 12, as the etch process stops at the silicon dioxide insulating layer 12, thereby leaving an exposed front portion 29 of the insulating layer 12, which a this stage remains as a sort of membrane, see FIG. 1i. Also here, the KOH etch may use a hot aqueous solution of 28% by weight of KOH at 80° C. in temperature. The etch time of the front side etch may be around 20 minutes.

The remaining exposed silicon dioxide layers 18a, 18b and 12 are now stripped in BHF, see FIG. 1j, whereby a through-hole 30 is formed under the pyramidal shape 28, where the silicon has been etched from the front side.

Here it should be noted that by using the double-sided etching processes of the present invention, an embodiment of which is described above in connection with FIGS. 1a–1j, the area of the exposed back portion 26 of the insulating silicon dioxide layer 12 may vary a great deal due to the variations in the thickness of the back silicon layer 13, which here may vary within ±25 μm. However, the front silicon layer 11 is much thinner and has a much lesser variation in the thickness, which here is about ±2 μm. Thus, the area of the exposed front portion 29 will only have a very small variation within different samples, and thereby result in a through-hole 30 having very well defined cross-sectional dimensions. This may be of great importance if a hermetic sealing is to be obtained by subsequent steps of processing.

It should be understood that although only one through-hole 30 is shown in FIG. 1j, a number of through-holes may be formed during the above described processes. The cross-sectional dimension of each through-hole will be defined by the corresponding area of silicon 27 exposed for the front side etching, and the thickness of the front silicon layer 11.

Various steps of metallization processes according to the present invention are illustrated in FIGS. 1k–1s. These steps show the formation of a feed-through metallization reaching through a previous formed through-hole 30 resulting in a hermetic sealing of the through-hole 30.

The first steps of the formation of the feed-through metallization are illustrated in FIG. 1k. Here, a thermal silicon dioxide 31 is grown in all exposed silicon areas. This silicon dioxide layers serves as dielectric layer. Next, a first thin metallization layer 32a, 32b is evaporated on both sides of the wafer. This first metallization layer 32a, 32b comprises an adhesion layer (e.g. 10 nm titanium) and a metal layer that is suitable to serve as plating base for electroplating (e.g. 100 nm gold, but palladium or copper may also be used). Next, a layer 33a, 33b of electro-depositable photo-resist (e.g. Eagle 2100 ED/PR from Shipley) is electro-deposited on both sides of the wafer.

The photoresist 33a, 33b on both sides is now patterned with masks for the feed-through metallization, where after the feed-through metallization (e.g. 3–4 μm copper) 34a, 34b is electroplated using the photoresist as mould, see FIG. 1l. On top of the feed-through metallization a layer of a diffusion barrier (e.g. 200 nm nickel) and a wetting layer (e.g. 800 nm, nickel) are electroplated in one step, 35a, 35b.

Next, as illustrated in FIG. 1m, the photoresist 33a, 33b is stripped and the exposed parts of the plating base 32a, 32b are etched selectively to the feed-through metallization 34a, 34b, and the combined barrier/wetting layer 35a, 35b.

Layers of stress-reduced silicon-oxynitride 36a, 36b are then deposited on both sides using plasma-enhanced-chemical-vapour-deposition (PECVD). These layers 36a, 36b serve as solder dam and passivation and are about 1 μm thick, see FIG. 1n.

A layer of chromium 37a, 37b is now deposited on both sides in subsequent evaporation or sputtering processes. The chromium serves as plating base for subsequent electro-deposition of a new layer of electro-depositable photoresist 38a, 38b on both sides (e.g. Eagle 2100 ED/PR from Shipley), see FIG. 1o.

The electro-depositable photoresist 38a, 38b is then patterned on both sides with respective masks for bonding and contact pads 39a, 39b, and the exposed chromium 37a, 37b is stripped in Cerium (IV)-sulphate/nitric acid. The now exposed silicon-oxynitride 36a, 36b PECVD layer is etched in BHF using the photoresist layer 38a, 38b and the remainder of the chromium layer 37a, 37b as mask, see FIG. 1p.

From here, the photoresist 38a, 38b and the remaining part of the chromium layer 37a, 37b are stripped, see FIG. 1q.

The surface of the exposed wetting layer (bonding and contact pads) is converted into a non-oxidising metal by ion-exchange plating of an anti-oxidation barrier 40a, 40b (e.g. 100 nm gold, using ORMEX from Engelhard), see FIG. 1r.

Finally, a solder material 41 (e.g. lead/tin or tin/silver) is deposited onto the bonding pads 39b either by electroplating into a mould of electro-depositable photoresist or by using preforms. The deposited solder material is shown in FIG. 1s.

It should be understood that different dimensions may be selected for the semiconductor lid according to the present invention. However, it is important that a relatively small and well-defined through-hole 30 is obtained at the etch resistant layer 12 in order to secure a hermetic sealing by the feed-through metallization. As an example of the dimensions of an embodiment of a lid of the present invention, the semiconductor structure of the lid may have a square form with outer side lengths of about 3 mm. The back layer 13 may have been etched in a square formed back surface area 23 having surface side lengths of about 2 mm, whereby the etching of the back layer is large enough to give room for electronic or optoelectronic components to be covered by the lid. For each through-hole, a corresponding separate front surface area 27 is etched. Here, for a front layer thickness of about 20 μm, each such front surface area may have a square form with side lengths of about 33 μm. This may result in exposed front portions 29 in etch resistant layer 12 having a square form with side lengths of about 5 μm. If several through-holes or an array of through-holes are needed, the through holes may be arranged so that the distance between two adjacent through-holes at the front surface of the lid is at least 5 μm, such as at least 10 μm.

The above described double-sided through-hole process using SOI material allows for a reproducible, well-defined through-hole opening 30. When using standard, pure silicon material without an interfacial etch resistant layer, either the mask dimensions for defining the through-holes must be adjusted to the silicon thickness, or the silicon thickness must be adjusted to the mask dimensions. It is preferred that the deviation of a resulting through-hole opening 30 must not exceed a low, one-digit number of micrometers (e.g. 3 μm). This is easily achieved with wafer of SOI material having a front layer 11 with a thickness of 20 μm. Here, the thickness variation is usually ±10% or better, which yields a lateral through-hole opening variation of max. 2.8 μm.

Figure 2:
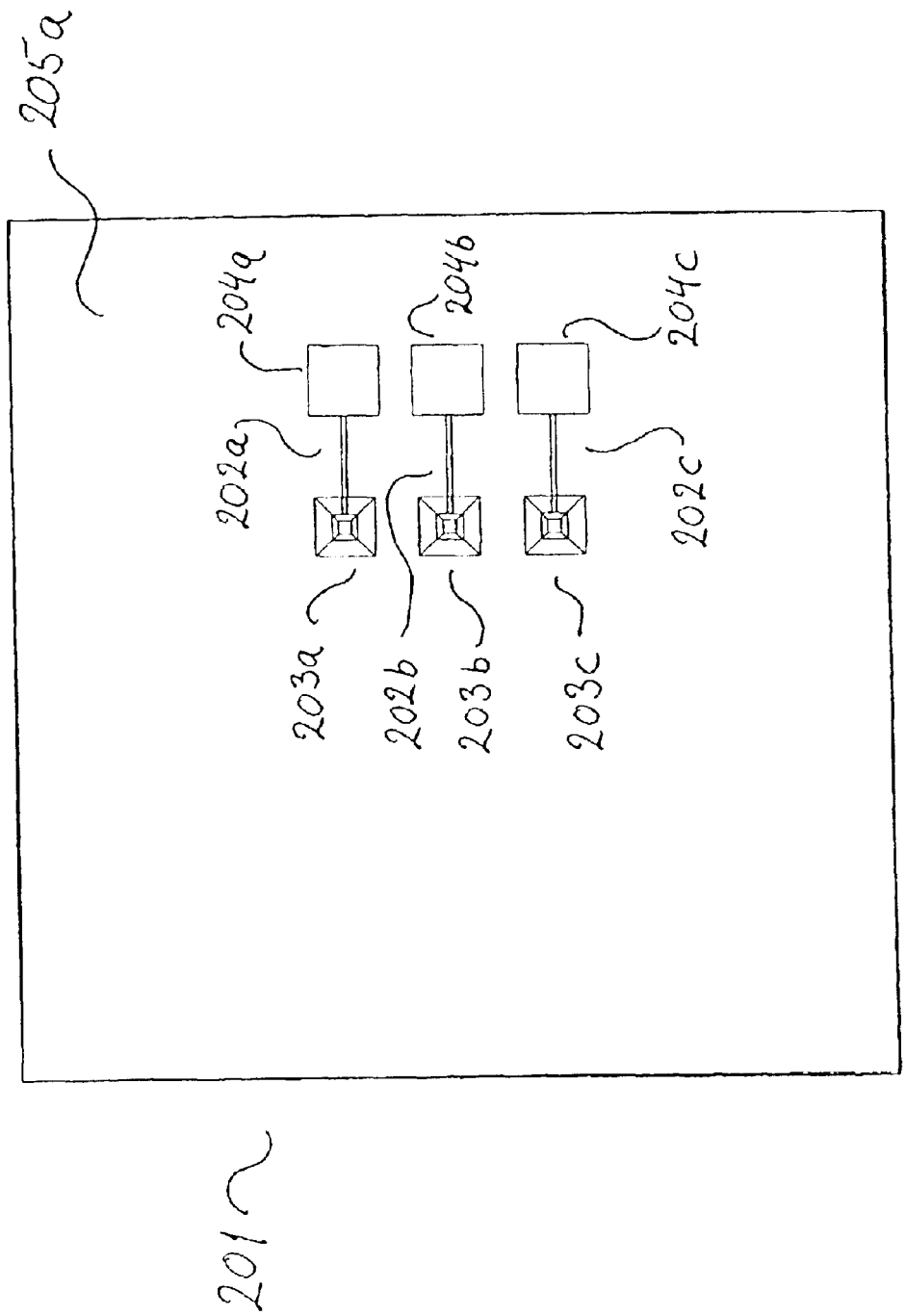
FIG. 2 shows a top or front plan view of a first embodiment of a semiconductor structure according to the present invention.
Figure 3:
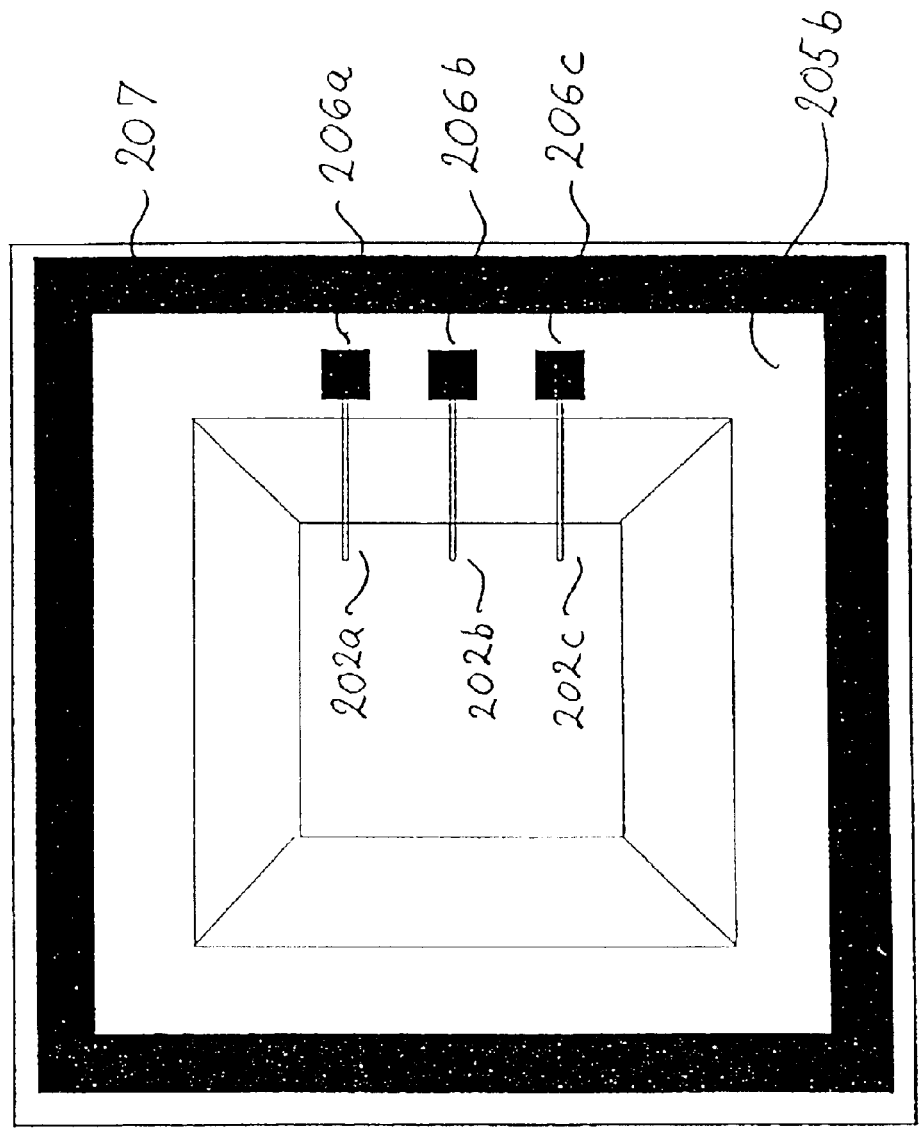
FIG. 3 shows a bottom or back plan view of the semiconductor structure of FIG. 2.

A semiconductor lid according to an embodiment of the present invention, and which may be fabricated in accordance with the processes described in connection with FIGS. 1a–1s, is illustrated in FIGS. 2 and 3. Here, FIG. 2 shows the top (front side) view of the lid 201, in which the lid is carrying three though-hole connections 202a, 202b, 202c. On the front side of the lid 201, each through-hole connection 202a, 202b, 202c reaches from a front side part of a through-hole 203a, 203b, 203c to a bonding or contact pad 204a, 204b, 204c, which may be gold coated. The through-holes 203a, 203b, 203c are closed or hermetically sealed by the electroplated feed-through metallization serving as the base for the through-whole connection 202a, 202b, 202c. The front side of the lid 201 and the through-hole connections 202a, 202b, 202c are covered by a passivation layer 205a, except for the openings to the bonding or contact pads 204a, 204b, 204c.

A cross-sectional side view of the semiconductor lid 201 corresponds to the structure of FIG. 1s.

FIG. 3 shows a bottom or back plan view of the semi-conductor structure of FIG. 2. Here, the through-hole connections 202a, 202b, 202c extend from a backside part of the through-holes 203a, 203b, 203c to bonding pads having solder interconnect bumps 206a, 206b, 206c. A solder sealing ring 207 is also formed on the backside of the lid when depositing the solder material for the solder bumps 206a, 206b, 206c. Also the backside of the lid 201 and the through-hole connections 202a, 202b, 202c are covered by a passivation layer 205b, except for the openings to the solder bumps 206a, 206b, 206c and the solder sealing ring 207.

For the semiconductor structure described in connection with FIGS. 1a–1s, a low resistivity of about 1–20 $\Omega$cm was chosen for both the front layer 11 and the back layer 13.

However, it is also within embodiments of the present invention to use a semiconductor or a semiconductor structure, such as the SOI structure, having a high resistivity. Such high resistivity semiconductors or structures may be suitable for high frequency purposes, where one or more high frequency signals are to be conducted by through-hole connections, which may comprise a feed-through metallization according to the present invention.

The frequency of a high frequency signal is limited by the ohmic resistance and the capacitance of the interconnection through 1/RC. Thus, the problem is to obtain a through-hole connection with a low ohmic resistance and a low capacitance between the connection and the underlying layer of silicon. High frequency lids may be used for optoelectronic assemblies comprising signal lasers and/or detectors for telecommunication purposes. The frequency may be as high as 100 GHz.

The low ohmic resistance demands a high cross-sectional area of the connection, while a low capacitance requires a connection having a small area of the interface with the silicon and a relatively high resistivity of the underlying silicon. Thus, the solution to the problem is to use a silicon layer or substrate having a high resistivity, and to reduce the length and width of the interconnection on the surface of the silicon to a minimum, while keeping the interconnection as thick as possible. The resistivity may be around or in the range of 3 k$\Omega$cm to 4 k$\Omega$cm or even higher. This requirement may be considered for the front layer as well as for the back layer. Thus, for high frequency purposes it may also be convenient to use un-doped silicon.

It is also desirable to have the through-hole connection(s) as thick as possible. However, the feed-through metallization should still provide a hermetic sealing. It is not essential that each through-hole has the same cross-sectional area. Thus, the high frequency lids may be formed from a pure single crystalline silicon wafer. However, it is preferred to use a SOI structure and the techniques described in connection with FIGS. 1 and 2.

The present invention also provides a solution, in which a high current may pass through a semiconductor structure or lid. Here, the problem is to obtain a large cross-sectional area of the metallization through the lid, in order to allow a high current to pass through the lid, while at the same time maintain a high mechanical stability of the lid. Furthermore, it should also be easy to obtain a hermetic sealing of the lid. The high current lids may for example be used for coverage of pump lasers.

According to an embodiment of the present invention, a solution is provided in which several or an array of through-hole connections or metallizations are used for a high current connection, each through-hole connection or metallization passing through a through-hole of the semiconductor structure or lid. Each through-hole should have a relatively small cross-sectional area, whereby the mechanical strength of the lid is maintained. The total cross-sectional area given by the used number of through-holes should be large enough to allow the needed high current, with the current density at this position being below or well below the critical current density (maximum density) of the feed-through metallization.

It should be noted that if the high current connection is made as one, thick feed-through, the semiconductor structure or lid may break into pieces when heated due to different thermal expansion in the semiconductor and the metal.

The semiconductor structure or lid may have several high current connections, each connection having a number or an array of through-hole connections or metallizations.

It is not essential that each through-hole has the same cross-sectional area. Thus, the high current lids may be formed from a pure single crystalline silicon wafer. However, it is preferred to use a SOI structure and the techniques described in connections with FIGS. 1 and 2. Due to the tapered from of the through-holes from the SOI structure, the metal of the feed-through metallizations may expand upwards when heated, resulting in a stronger lid.

Figure 4:
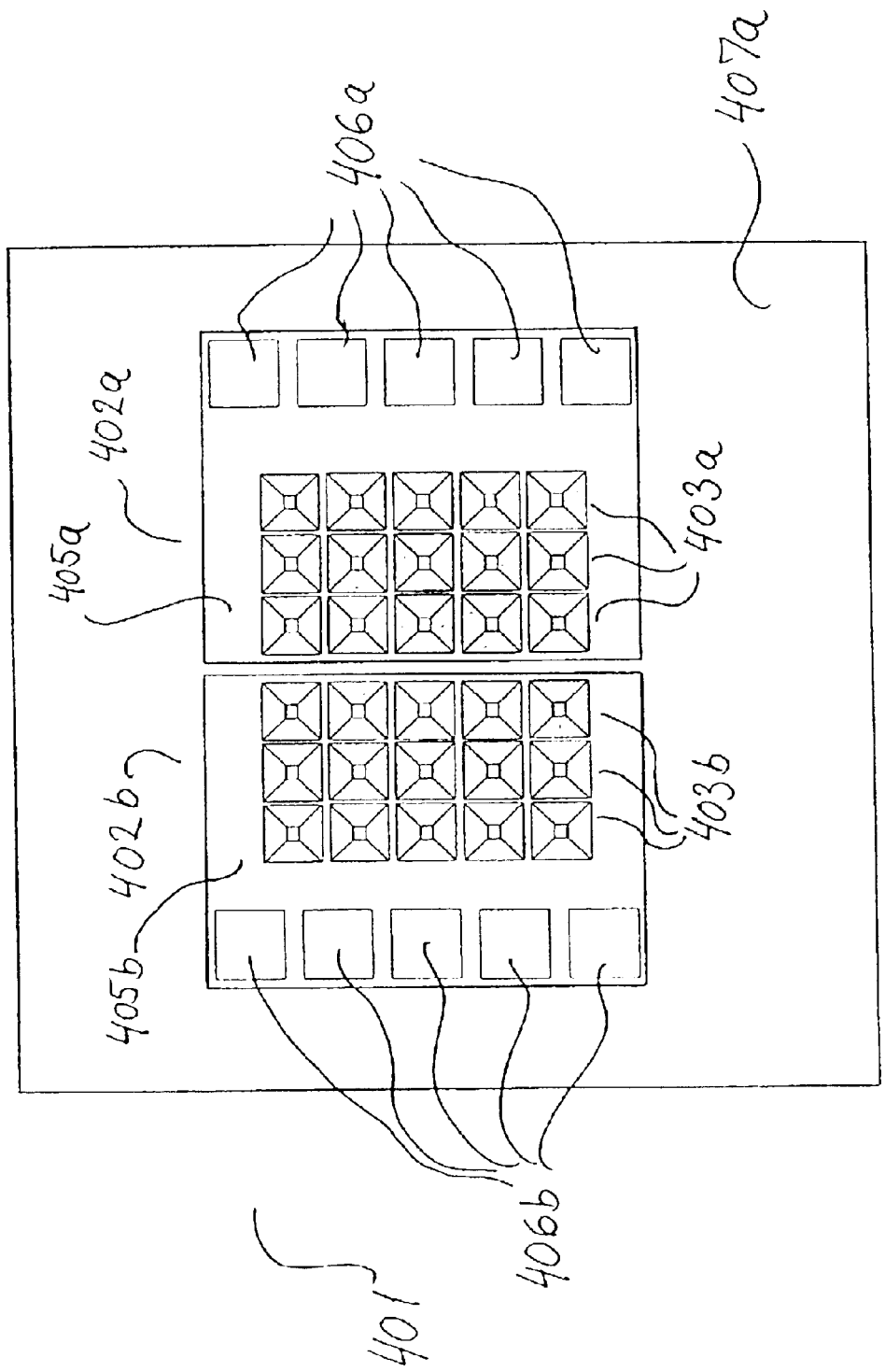
FIG. 4 shows a top or front plan view of a second embodiment of a semiconductor structure according to the present invention.

FIG. 4 shows a top or front plan view of an embodiment of a semiconductor lid 401 with two current connections 402a, 402b suitable for drawing a high current. Each connection 402a, 402b comprises an array of several through-hole connections 403a, 403b, with each through-hole connection having a metallization passing from the front side of the lid, through a through-hole to the backside of the lid. Each feed-through metallization is tapered downwards from the front side, thereby having a rather small cross-sectional area at the bottom compared to the cross-sectional area at the top. Thus, each through-hole is totally covered and sealed by the feed-through metallization. The feed-through metallizations of one current connection 402a or 402b are electrically connected to each other on both sides of the through-holes, and on the front side of the lid 401, a front side metallization 405a or 405b connects the through-hole connections 403a or 403b and corresponding bonding or contact pads 406a or 406b, which may be gold coated. The front side of the lid 401 and the through-hole connections 403a, 403b are covered by a passivation layer 407a, except for the openings to the bonding or contact pads 406a, 406b.

Figure 5:
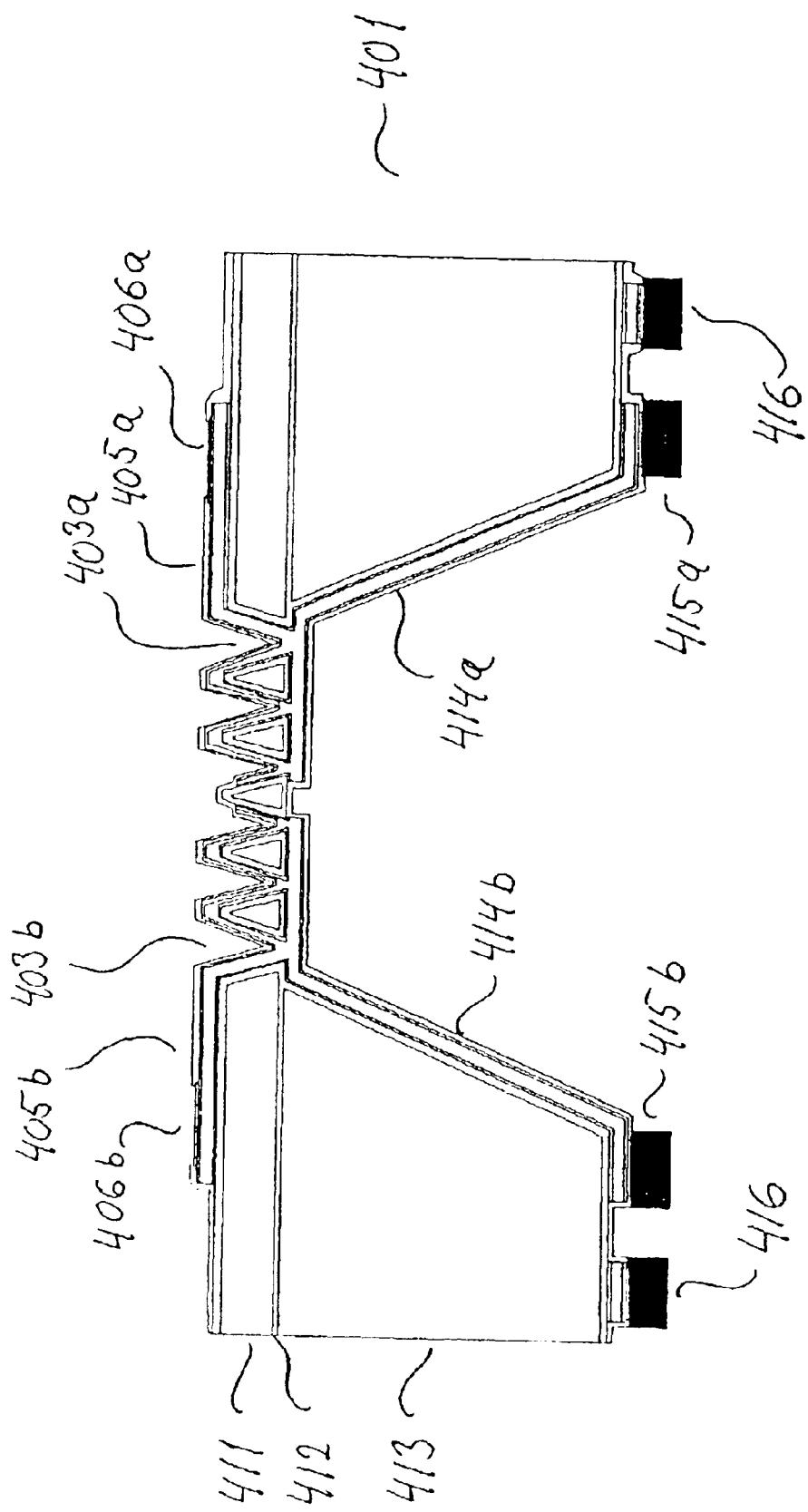
FIG. 5 shows a cross-sectional side view of the semiconductor structure of FIG. 4.

In FIG. 5 is shown a cross-sectional side view of the semiconductor lid of FIG. 4. Here, the lid 401 has a silicon front layer 411, a silicon dioxide layer 412, and a silicon back layer 413. FIG. 5 also shows the through-hole connections 403a, 403b, with corresponding front side metallizations 405a, 405b and bonding or contact pads 406a, 406b. The through-hole connections 403a or 403b of one current connection 402a or 402b are connected at the bottom side of the lid 401 to a bottom side metallization 414a or 414b, which again is connected to solder bumps, 415a or 415b. The bottom of the lid 401 also comprises a solder sealing ring 416 for sealingly connecting the lid to a substrate.

Figure 6:
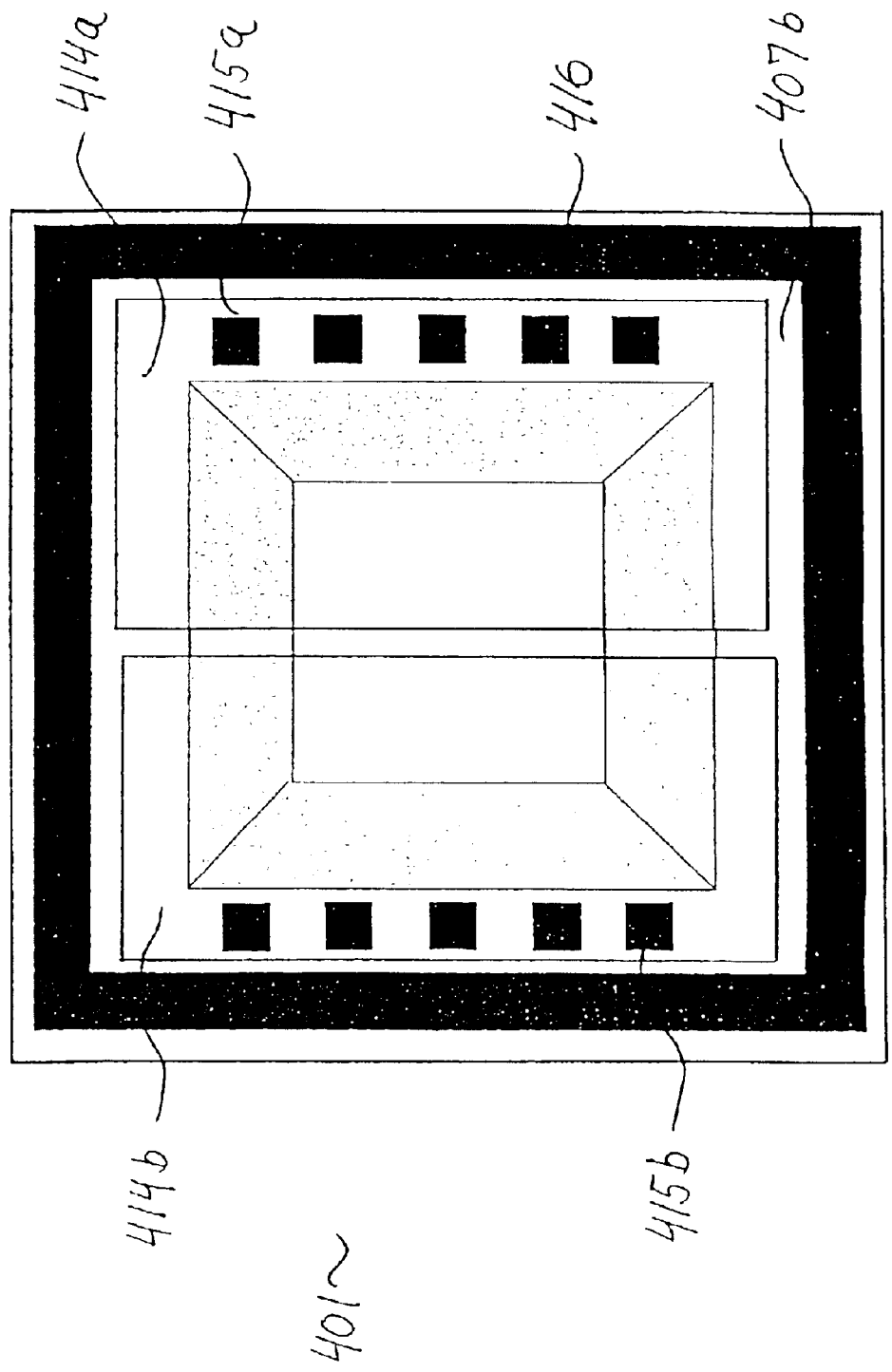
FIG. 6 shows a bottom or back plan view of the semiconductor structure of FIG. 5.

In FIG. 6 is shown a bottom or back plan view of the semiconductor lid of FIGS. 4 and 5. Here, each bottom side metallization 414a, 414b extend from the backside part of corresponding through-holes to the corresponding solder bumps 415a, 415b. Also the backside of the lid 401 and the bottom side metallizations 414a, 414b are covered by a passivation layer 407b, except for the openings to the solder bumps 415a, 415b and the solder sealing ring 416.

The present invention also provides a solution, in which a semiconductor structure or lid may have an integrated electronic circuit integrated in a front layer of the structure or lid. Hereby, a simple and cheap solution may be provided for arranging an integrated electronic circuit into an optoelectronic assembly.

According to a preferred solution a silicon wafer is used in which a number of integrated electronic circuits have been processed on the top surface or in the front layer. The wafer is to be further processed into a number of structures or lids. If one electronic circuit is needed for each lid or structure, then one circuit is processed in an arrangement corresponding to the arrangement of each lid or structure. If two circuits are needed for each lid or structure, then two circuits are processed in an arrangement corresponding to the arrangement of each lid or structure.

In order to obtain through-hole connections from the front of the lid and to the interior of the lid, whereby electrical connections may be provided between the integrated circuit and elements within an optoelectronic assembly using the lid as a coverage, it is preferred to use a SOI structure and double-sided etching processes as described on connections with FIGS. 1 and 2.

Thus, according to an aspect of the present invention, there is provided a semiconductor lid having one or more integrally formed electronic circuits processed in the outer semiconductor top surface layer of the lid, and a number of conductive vias or through-hole connections being provided through the lid from the outer surface or outer surface layer of the lid to the inside of the lid for establishing one or more electrical connections through said lid. It is preferred that at least part of said through-hole connections are bonded or in electrical contact with one of said electronic circuits in the outer semiconductor surface layer. Each through-hole connection may have a corresponding through-hole formed in the lid, and said through-holes may be hermetically sealed by the formation of the through-hole connections. Such through holes may be formed by one or more etching processes, which may include both a front layer etching and a back layer etching.

It is not essential that each through-hole has the same cross-sectional area. Thud, the lids may be formed from a pure single crystalline silicon wafer. However, it is preferred to use a SOI structure as described above.

For many applications it is desirable to have a semiconductor lid including a cooling element or an active cooling element. Such applications may include semiconductor lids designed for high currents. It is preferred that an active cooling element in the form of a Peltier element is arranged on top of the semiconductor lid.

A Peltier element may be formed by processing different layers of metal on top of the lid. Thus, when the whole silicon wafer has been processed in order to obtain a number of semiconductor lids, some extra processing steps may be added to form different layers of metal on top of the whole wafer. After such metallization steps, the wafer may be divided into separate lids, each lid having a Peltier element formed on the outer top surface. In some embodiments it is preferred to further arrange a heat-sink on top of the Peltier element.

Thus, according to an aspect of the present invention, there is provided a method of forming an active cooling element on top of each of a number of semiconductor lids, wherein said number of lids are processed in a whole semiconductor wafer, and wherein said cooling element formation comprises the formation of several different metal layers on top of the whole wafer and on top of each other. It is preferred that the formed metal layers are selected so as to form a Peltier element on each lid, when the processed wafer has been divided in to a number of separate lids. The semiconductor wafer may be a single crystalline silicon wafer, or it may be a wafer having an SOI (silicon on insulator) structure. The semiconductor lids may be high current type lids, wherein several through-hole connections are used to provide a high current connection. The high current lids may have a structure as described above, including a SOI structure.

The present invention also covers embodiments in which a semiconductor lid is used as a cover of an optoelectronic assembly or subassembly. Here, the lid may have one or more through-holes with corresponding through-hole connections for providing electrical connections from the outer surface of the lid to the inner surface of the lid. A through-hole connection may have a corresponding through-hole formed in the lid, and said through-hole may be hermetically sealed by the formation of the through-hole connections. Such through-holes may be formed by one or more etching processes, which may include both a front layer etching and a back layer etching.

The lids may be formed from a pure single crystalline silicon wafer. However, it is preferred to use a SOI structure, as described above.

Figure 7:
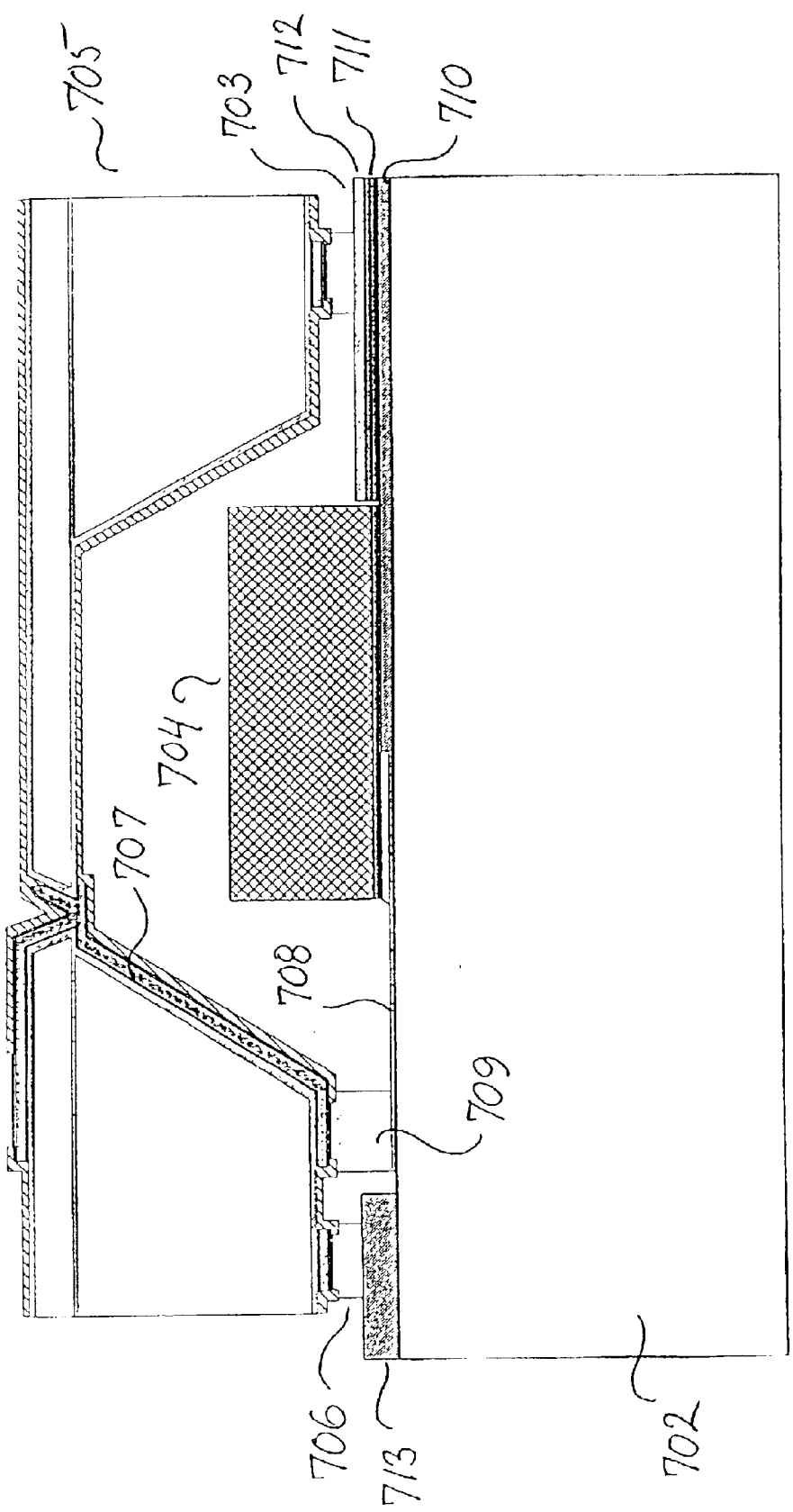
FIG. 7 shows an embodiment of an optoelectronic assembly structure according to the present invention.

In FIG. 7 is illustrated an embodiment of an optoelectronic assembly according to the present invention. Here, the optoelectronic assembly 701 has a semiconductor base 702 with an optical waveguide 703 formed on or arranged on an upper surface of the base 702. An optoelectronic component 704 is also arranged on the upper surface of the base 702 being optically coupled to the waveguide 703. A semiconductor lid 705 is sealingly arranged on the upper surface of the base 702 via a solder sealing ring 706 and the lid 705 is covering the component 704. The lid 705 has a feed-through metallization 707 providing a current path from the upper surface of the lid 705, via a through-hole and down to the bottom of the lid. The feed-through metallization is electrically connected to the component 704 via a connection metallization 708 on the surface of the base 702 and via a solder interconnect 709. The waveguide 703 is here formed by a bottom cladding layer 710, a core layer 711, and a top cladding layer 712. Outside the waveguide 703 region, no core layer 711 is provided and a cladding layer 713 is covering the surface of the base 702. The solder sealing ring 706 is soldered to the cladding layers 712 and 713.

The shown lid 705 has a SOI structure and the lid 705 may be fabricated using the processes as described in connection with FIG. 1.

So far, silicon wafers have been used to illustrate embodiments of the present invention. However, other semiconductor materials may be used, such as III–IV compound semiconductors.

Other implementations are within the scope of the following claims.

What is claimed is:

1. A method of providing a semiconductor structure with one or more through-holes, the semiconductor structure comprising a front surface and a back surface substantially opposite, a front semiconductor layer facing the back surface a second semiconductor layer facing the front surface, and a substantially etch-resistant layer arranged between the first and second semiconductor layer, the method comprising:

etching from the back surface through the first back semiconductor layer;

stopping the etching from the back surface when a back position of the etch-resistant layer is exposed, the exposed back portion of the etch-resistant layer corresponding to positions of the one or more through-holes;

etching from the front surface through the second semiconductor layer;

stopping the etching from the front surface when a front portion of the of the etch-resistant layer is exposed, the exposed front portion of the etch-resistant layer corresponding to positions of the one or more through-holes;

removing at least the part of the etch-resistant layer corresponding to positions of the one or more through-holes to form the one or more through-holes after the etching; and hermetically sealing the one or more through-holes.

2. A method according to claim 1 including using a feed-through metallization process to seal one or more through-holes.

3. The method of claim 2 including using the semiconductor structure as a lid to encapsulate an integrated circuit, wherein the feed-through metallization provides electrical contact from an exterior of the semiconductor structure to the integrated circuit.

4. A method according to claim 2 including using the semiconductor structure as a lid to encapsulate an opto-electronic component.

5. The method of claim 4 wherein the feed-through metallization provides electrical contact from an exterior of the semiconductor structure to the opto-electronic component.

6. The method of claim 4 including establishing an electrical connection to the opto-electronic component via the one or more through-holes.

7. The method of claim 4 wherein etching the back surface includes forming a recess in the back surface of the semiconductor structure, and locating the opto-electronic component in an area defined by the recess.

8. A method according to claim 1 wherein the etching of the back surface comprises exposing a back portion of the etch-resistant layer having an area larger than any exposed front portion of the etch resistant layer.

9. A method according to claim 1 wherein the etch-resistant layer comprises material selected from the group of silicon nitride, silicon oxynitride and silicon dioxide.

10. A method according to claim 1 wherein the etch-resistant layer comprises a sandwich layer comprising alternating layers of at least silicon dioxide, silicon nitride and silicon oxynitride.

11. The method of claim 1 including using electroplating technique to seal the one or more through-holes.

12. The method of claim 11 wherein sealing the one or more through-holes includes:

providing an adhesion layer;

providing a plating base; and providing a feed-through metallization.

13. A method of providing a semiconductor structure with one or more through-holes, the semiconductor structure comprising a front surface and a back surface substantially opposite a first semiconductor layer facing the back surface, a second semiconductor layer facing the front surface and a substantially etch-resistant layer arranged between the first and second semiconductor layer, the method comprising;

etching from the back surface through the first semiconductor layer;

stopping the etching from the back surface when a back portion of the of the etch-resistant layer is exposed, the exposed back portion of the etch-resistant layer corresponding to positions of the one or more through-holes;

etching from the front surface through the second semiconductor layer;

stopping the etching from the front surface when a front portion of the of the etch-resistant layer is exposed, the exposed front portion of the etch-resistant layer corresponding to positions of the one or more through-holes;

removing at least the part of the etch-resistant layer corresponding to positions of the one or more through-holes to form the one or more through-holes after the etching; and using a feed-through metallization process to seal at least one of the through-holes, wherein sealing at least one of the through-holes includes:

providing an adhesion layer;

providing a plating base;

providing a feed-through metallization;

providing a diffusion burner;

providing a wetting layer; and providing an antioxidation barrier.

14. The method of claim 13 including hermetically sealing the one or more through-holes.

* * * * *